(12) United States Patent
Sato et al.

(10) Patent No.: US 8,841,664 B2
(45) Date of Patent: Sep. 23, 2014

(54) SEMICONDUCTOR DEVICE

(75) Inventors: Hitomi Sato, Isehara (JP); Takayuki Saito, Atsugi (JP); Kosei Noda, Atsugi (JP); Toru Takayama, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/404,516

(22) Filed: Feb. 24, 2012

(65) Prior Publication Data

US 2012/0223305 A1 Sep. 6, 2012

(30) Foreign Application Priority Data

Mar. 4, 2011 (JP) .................................. 2011-047098

(51) Int. Cl.
| | | |
|---|---|---|
| H01L 29/10 | (2006.01) | |
| H01L 29/786 | (2006.01) | |
| H01L 27/108 | (2006.01) | |
| H01L 29/49 | (2006.01) | |
| H01L 27/115 | (2006.01) | |

(52) U.S. Cl.
CPC ...... *H01L 29/7869* (2013.01); *H01L 29/78603* (2013.01); *H01L 29/78606* (2013.01); *H01L 27/10873* (2013.01); *H01L 29/4908* (2013.01); *H01L 27/1156* (2013.01)
USPC ....... 257/43; 257/E29.068; 438/104; 438/158

(58) Field of Classification Search
CPC .................................................. H01L 27/10873
USPC ............................................ 257/43; 438/158
See application file for complete search history.

(56) References Cited

U.S. PATENT DOCUMENTS

| 5,528,032 A | 6/1996 | Uchiyama |
|---|---|---|
| 5,731,856 A | 3/1998 | Kim et al. |

(Continued)

FOREIGN PATENT DOCUMENTS

| EP | 1737044 A | 12/2006 |
|---|---|---|
| EP | 2226847 A | 9/2010 |

(Continued)

OTHER PUBLICATIONS

Pacchioni et al., "Electronic structure of the paramagnetic boron oxygen hole center in B-doped SiO2," Sep. 18, 2001, Physical Review B, vol. 64, Article 155201, pp. 1-7.*

(Continued)

*Primary Examiner* — Matthew W Such
*Assistant Examiner* — Samuel Lair
(74) *Attorney, Agent, or Firm* — Eric J. Robinson; Robinson Intellectual Property Law Office, P.C.

(57) ABSTRACT

Provided is a highly reliable semiconductor device by giving stable electric characteristics to a transistor in which a semiconductor film whose threshold voltage is difficult to control is used as an active layer. By using a silicon oxide film having a negative fixed charge as a film in contact with the active layer of the transistor or a film in the vicinity of the active layer, a negative electric field is always applied to the active layer due to the negative fixed charge and the threshold voltage of the transistor can be shifted in the positive direction. Thus, the highly reliable semiconductor device can be manufactured by giving stable electric characteristics to the transistor.

24 Claims, 17 Drawing Sheets

(56) References Cited

U.S. PATENT DOCUMENTS

| | | | |
|---|---|---|---|
| 5,744,864 A | 4/1998 | Cillessen et al. | |
| 5,821,585 A * | 10/1998 | Maegawa | 257/347 |
| 5,936,291 A | 8/1999 | Makita et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 6,844,604 B2 | 1/2005 | Lee et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,592,666 B2 * | 9/2009 | Noguchi et al. | 257/324 |
| 7,674,650 B2 | 3/2010 | Akimoto et al. | |
| 7,732,819 B2 | 6/2010 | Akimoto et al. | |
| 2001/0046027 A1 | 11/2001 | Tai et al. | |
| 2002/0039816 A1 | 4/2002 | Watanabe | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0072439 A1 | 3/2007 | Akimoto et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296567 A1 * | 12/2008 | Irving et al. | 257/43 |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0166641 A1 * | 7/2009 | Jeong et al. | 257/72 |
| 2009/0278122 A1 | 11/2009 | Hosono et al. | |
| 2009/0280065 A1 | 11/2009 | Hosono et al. | |
| 2010/0060758 A1 * | 3/2010 | Oshiyama et al. | 348/294 |
| 2010/0065844 A1 | 3/2010 | Tokunaga | |
| 2010/0072470 A1 * | 3/2010 | Yamazaki et al. | 257/43 |
| 2010/0092800 A1 | 4/2010 | Itagaki et al. | |
| 2010/0109002 A1 | 5/2010 | Itagaki et al. | |
| 2010/0120197 A1 * | 5/2010 | Levy et al. | 438/104 |
| 2010/0181575 A1 * | 7/2010 | Makita et al. | 257/72 |
| 2010/0224946 A1 | 9/2010 | Oshiyama et al. | |
| 2011/0031497 A1 * | 2/2011 | Yamazaki et al. | 257/59 |
| 2011/0140116 A1 * | 6/2011 | Morosawa et al. | 257/59 |
| 2011/0281394 A1 * | 11/2011 | Yamazaki | 438/104 |
| 2012/0009710 A1 * | 1/2012 | Kim | 438/46 |
| 2012/0319106 A1 * | 12/2012 | Yamazaki et al. | 257/43 |
| 2012/0319108 A1 * | 12/2012 | Sakata et al. | 257/43 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 04-037168 A | 2/1992 |
| JP | 05-251705 A | 9/1993 |
| JP | 06-275697 A | 9/1994 |
| JP | 08-264794 A | 10/1996 |
| JP | 10-010558 A | 1/1998 |
| JP | 10-093096 | 4/1998 |
| JP | 10-223904 A | 8/1998 |
| JP | 11-505377 | 5/1999 |
| JP | 11-302026 A | 11/1999 |
| JP | 2000-044236 A | 2/2000 |
| JP | 2000-150900 A | 5/2000 |
| JP | 2002-076356 A | 3/2002 |
| JP | 2002-110973 | 4/2002 |
| JP | 2002-289859 A | 10/2002 |
| JP | 2002-319583 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 | 4/2007 |
| JP | 2007-123861 | 5/2007 |
| JP | 2010-206022 A | 9/2010 |
| WO | WO-2004/114391 | 12/2004 |
| WO | WO 2010147483 A1 * | 12/2010 |

OTHER PUBLICATIONS

Fortunato.E et al., "Wide-Bandgap High-Mobility ZnO Thin-Film Transistors Produced At Room Temperature,", Appl. Phys. Lett.

(56) References Cited

OTHER PUBLICATIONS (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Park.J et al., "Improvements in the Device Characteristics of Amorphous Indium Gallium Zinc Oxide Thin-Film Transistors by Ar Plasma Treatment,", Appl. Phys. Lett. (Applied Physical Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTS,", SID Digest '08 : SID International Symposium Digest of Technical Papers, May 20. 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3-Ga2ZnO4-ZnO system at 1350° C.,", Journal of Solid State Chemistry, Aug. 1, 1991, vol. 93, No. 2, pp. 298-315.

Kimizuka.N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System,", Journal of Solid State Chemistry, Apr. 1, 1995, vol. 116, No. 1, pp. 170-178.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N. et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World'S Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM—FPD '08 Digest of Technical Papers, Jul. 2, 2008, pp. 251-252, The Japan Society of Applied Physics.

Jeong.J et al., "3.1: Distinguished Paper: 12.1-Inch WXGA Amoled Display Driven by Indium—Gallium—Zinc Oxide TFTs Array,", SID Digest '08 : SID Interational Symposium Digest of Technical Papers May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits, 2008, vol. 43, No. 1, pp. 292-299.

Ohara.H et al., "Amorphous In—Ga—Zn—Oxide TFTs With Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition: The "Blue Phase",", Physics Letters, Sep. 10, 1973, vol. 45A, No. 2, pp. 115-116.

Cho.D et al., "21.2:AL and SN-Doped Zinc Indium Oxide Thin Film Transistors for AMOLED Back Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM—FPD '08 Digest of Technical Papers, Jul. 2, 2008, pp. 275-278.

Park.S et al., "Challenge to Future Displays: Transparent AM—OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM—FPD '09 Digest of Technical Papers, Jul. 1, 2009, pp. 41-44.

Osada.T et al., "Development of Driver-Integrated Panel Using Amorphous In—Ga—Zn—Oxide TFT,", AM—FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs,", Journal of the SID, 2007, vol. 15, No. 1, pp. 17-22.

Hosono.H, "68.3:Invited Paper:Transparent Amorphous Oxide Semiconductors for High Performance TFT,", SID Digest '07, : SID International Symposium Digest of Technical Papers, 2007, vol. 38 pp. 1830-1933.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.

(56) References Cited

OTHER PUBLICATIONS

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N. et al., "Spinel,YBFE2O4, and YB2FE3O7 Types of Structures for Compounds in the IN2O3 and SC2O3-A2O3-BO Systems [A; Fe, Ga, Or Al; B: Mg, Mn, Fe, Ni, Cu,Or Zn] At Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID Interational Symposium Digest of Technical Papers, May 20, 2008, vol. 39, pp. 629-632.

Orita.M et al.,"Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", JPN. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters), 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al.,"Working hypothesis to explore novel wide band gap electrically conducting amorphous oxides and examples,", Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 276, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M at al., "Improving the Gate Stability of ZnO Thin-Film Transistors With Aluminum Oxide Dielectric Layers,", J. Electrochem. Soc. (Journal of Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

Nomura et al., "Room-Temperature Fabrication of Transparent Flexible Thin-Film Transistors Using Amorphous Oxide Semiconductors," Nature, Nov. 25, 2004, vol. 432, pp. 488-492.

Nomura et al., "Thin-Film Transistor Fabricated in Single-Crystalline Transparent Oxide Semiconductor," Science, May 23, 2003, vol. 300, No. 5623, pp. 1269-1272.

* cited by examiner

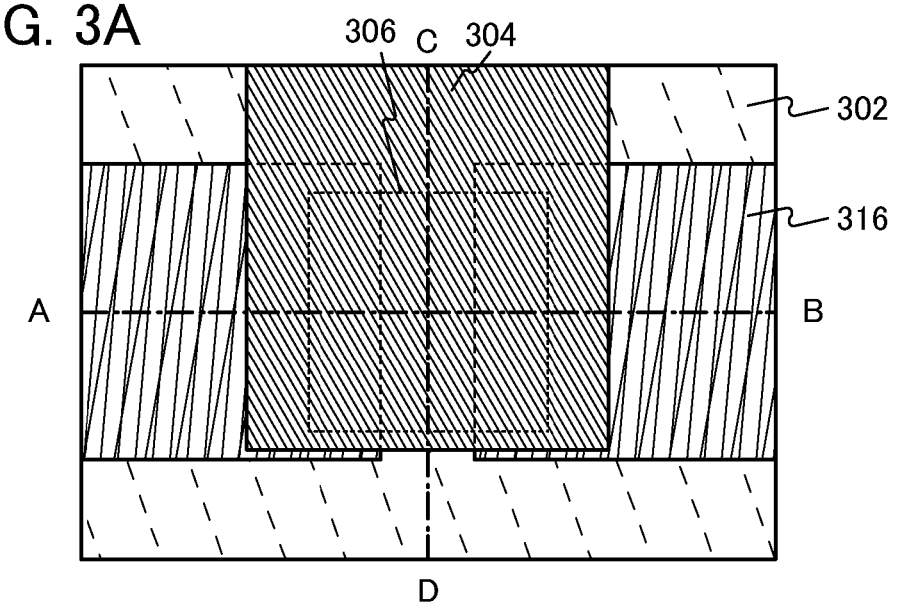
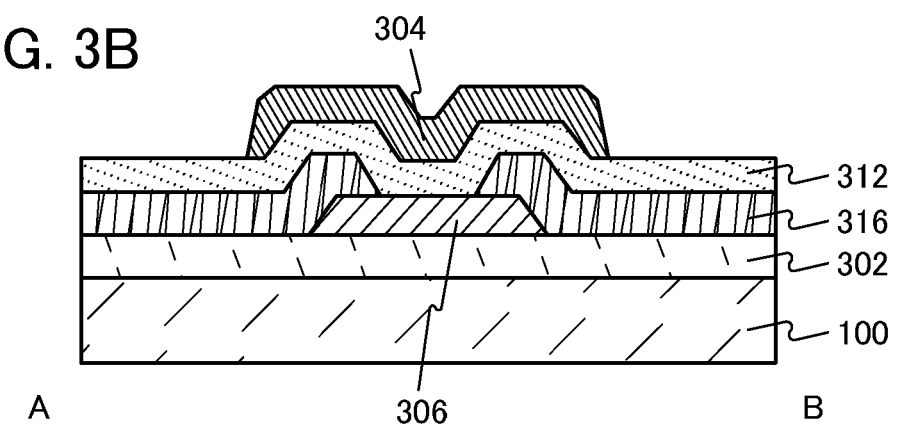
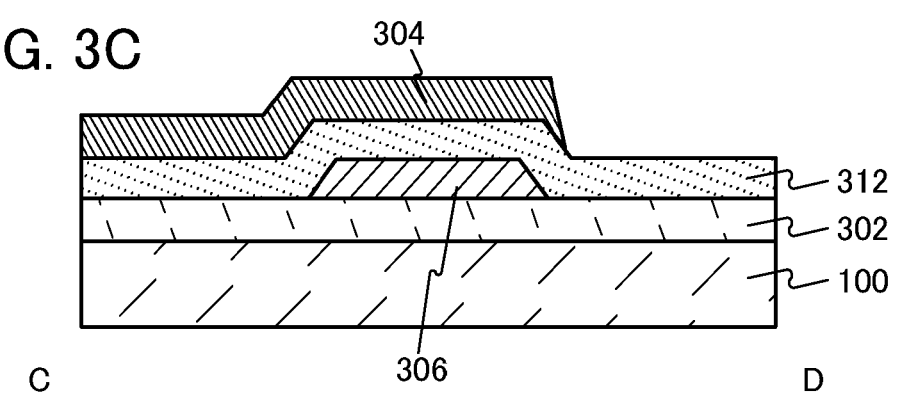

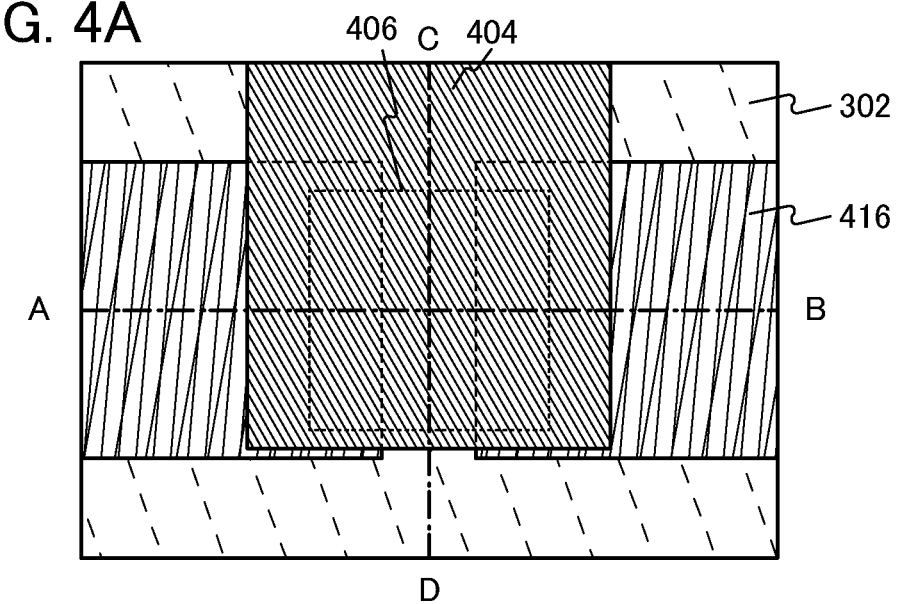
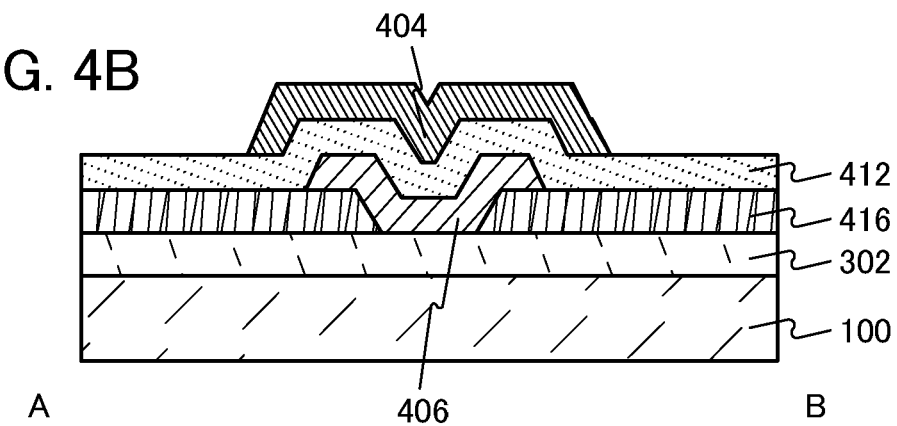
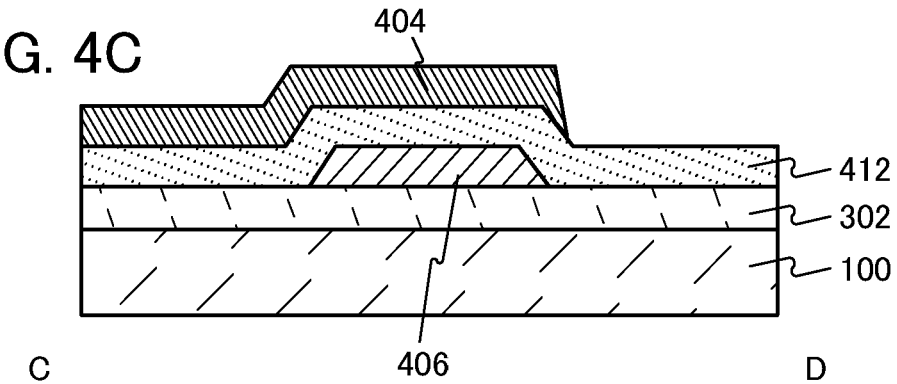

SEMICONDUCTOR DEVICE

BACKGROUND OF THE INVENTION

1. Field of the Invention

The present invention relates to a semiconductor device which includes a circuit including a semiconductor element such as a transistor. For example, the present invention relates to a power device which is mounted on a power supply circuit; a semiconductor integrated circuit including a memory, a thyristor, a converter, an image sensor, or the like; and an electronic device on which an electro-optical device typified by a liquid crystal display panel, a light-emitting display device including a light-emitting element, or the like is mounted as a component. Moreover, the present invention relates to an oxide used in the semiconductor device.

In this specification, a "semiconductor device" generally refers to a device which can function by utilizing semiconductor characteristics; an electrooptic device, a display device such as a light-emitting display device, a semiconductor circuit, and an electronic device are all included in semiconductor devices.

2. Description of the Related Art

Many transistors formed over a glass substrate or the like are manufactured using amorphous silicon, polycrystalline silicon, or the like, as typically seen in liquid crystal display devices. Although transistors including amorphous silicon have low field effect mobility, they can be formed over a larger glass substrate. On the other hand, although transistors including polycrystalline silicon have high field effect mobility, they are not suitable for being formed over a larger glass substrate.

Other than a transistor formed using silicon, a technique in which a transistor is formed using an oxide semiconductor and applied to an electronic device or an optical device has attracted attention. For example, a technique of manufacturing a transistor by using zinc oxide or In—Ga—Zn—O-based oxide as oxide semiconductor, and of using the transistor for a switching element of a pixel of a display device and the like is disclosed in Patent Document 1 and Patent Document 2.

REFERENCE

[Patent Document 1] Japanese Published Patent Application No. 2007-123861
[Patent Document 2] Japanese Published Patent Application No. 2007-096055

SUMMARY OF THE INVENTION

It is known that an oxide semiconductor generally has n-type conductivity and part of oxygen deficiency in an oxide semiconductor film serves as a donor and causes release of an electron which is a carrier. As a result, the use of an oxide semiconductor film as an active layer of a transistor might cause a shift of the threshold voltage of the transistor in the negative direction owing to the oxygen deficiency. Even a little oxygen deficiency in an oxide semiconductor film causes the shift of the threshold voltage of the transistor in the negative direction; thus, the transistor tends to have normally-on characteristics.

Thus, it is necessary to form an oxide semiconductor film such that oxygen deficiency is not caused therein; however, it is difficult to suppress also release of a little oxygen in heat treatment which is performed after the oxide semiconductor film is formed or in exposure of the oxide semiconductor film to a reduced-pressure atmosphere.

Further, there is a problem in that a transistor using silicon carbide, gallium nitride, or the like as an active layer tends to have normally-on characteristics because it is difficult to control the threshold voltage of the transistor.

In view of the above problems, one object is to manufacture a highly reliable semiconductor device by giving stable electric characteristics to a transistor in which a semiconductor film whose threshold voltage is difficult to control is used as an active layer.

One embodiment of the invention is based on the technical idea that a silicon oxide film having at least a negative fixed charge is used as a film in contact with an active layer of a transistor or a film in the vicinity of the active layer.

The silicon oxide film having a negative fixed charge refers to a silicon oxide film in which aluminum concentration is greater than or equal to 0.01 at. % and less than or equal to 10 at. %, preferably greater than or equal to 0.02 at. % and less than or equal to 5 at. %, more preferably greater than or equal to 0.05 at. % and less than or equal to 2 at. %. Further, as the silicon oxide film having a negative fixed charge, instead of aluminum, an element belonging to Group 13 such as boron (B), gallium (Ga), or indium (In) may be contained in the silicon oxide film By using the silicon oxide film having a negative fixed charge as a film in contact with an active layer of a transistor or a film in the vicinity of the active layer, a negative electric field is always applied to the active layer due to the negative fixed charge and the threshold voltage of the transistor can be shifted in the positive direction. Thus, a highly reliable semiconductor device can be manufactured by giving stable electric characteristics to the transistor.

A film formation method of a silicon oxide film having a negative fixed charge is described below. For example, a silicon oxide film may be formed by a sputtering method using a silicon oxide (quartz) target in which aluminum oxide is mixed. Alternatively, a silicon oxide film may be formed by a sputtering method using an aluminum oxide sintered body or an aluminum metal piece setting to a silicon oxide target. Further alternatively, a silicon oxide film may be formed by a multi-source sputtering method using a silicon oxide target and an aluminum oxide target.

Specifically, one embodiment of the present invention is a semiconductor device including a gate electrode, a gate insulating film covering the gate electrode, a pair of electrodes over the gate insulating film, a semiconductor film which at least partially overlaps with the gate electrode and is at least partially in contact with the pair of electrodes, and an insulating film over the semiconductor film. In the semiconductor device, at least one of the gate insulating film and the insulating film includes a silicon oxide film having a negative fixed charge.

In the above structure, the silicon oxide film having a negative fixed charge preferably has a surface charge density on a semiconductor film side of greater than or equal to $1 \times 10^{10}$ cm$^{-2}$ and less than or equal to $5 \times 10^{11}$ cm$^{-2}$. Further, the silicon oxide film having a negative fixed charge preferably includes aluminum of greater than or equal to 0.01 at. % and less than or equal to 10 at. %. Furthermore, the silicon oxide film having a negative fixed charge is formed by a sputtering method using a silicon oxide target including aluminum of greater than or equal to 0.01 at. % and less than or equal to 10 at. %, or a sputtering method using a silicon oxide target over which an aluminum oxide sintered body is set.

In each of the above-described structures, the semiconductor film includes a channel region, a source region, and a drain region, and the pair of electrodes is in contact with the source region and the drain region of the semiconductor film through an opening provided in the insulating film.

One embodiment of the present invention is a semiconductor device including a base insulating film, a semiconductor film over the base insulating film, a pair of electrodes which are partially in contact with the semiconductor film, a gate insulating film over the semiconductor film, and a gate electrode which at least partially overlaps with the semiconductor film with the gate insulating film interposed therebetween. In the semiconductor device, at least one of the base insulating film and the gate insulating film includes a silicon oxide film having a negative fixed charge.

In the above structures, it is preferable that the silicon oxide film having a negative fixed charge has a surface charge density on a semiconductor film side of greater than or equal to $1 \times 10^{10}$ cm$^{-2}$ and less than or equal to $5 \times 10^{11}$ cm$^{-2}$. Further, the silicon oxide film having a negative fixed charge preferably includes aluminum of greater than or equal to 0.01 at. % and less than or equal to 10 at. %. Furthermore, the silicon oxide film having a negative fixed charge is formed by a sputtering method using a silicon oxide target including aluminum of greater than or equal to 0.01 at. % and less than or equal to 10 at. %, or a sputtering method using a silicon oxide target over which an aluminum oxide sintered body is set.

In each of the above-described structure, the semiconductor film includes a channel region, a source region, and a drain region; an insulating film is provided between the pair of electrodes and the semiconductor film; and the pair of electrodes is in contact with the source region and the drain region of the semiconductor film through an opening provided in the insulating film.

In each of the above-described structure, the semiconductor film is preferably an oxide semiconductor film including two or more kinds of elements selected from In, Ga, Zn, and Sn.

A highly reliable semiconductor device can be manufactured by giving stable electric characteristics to a transistor in which a semiconductor film whose threshold voltage is difficult to control is used as an active layer.

BRIEF DESCRIPTION OF THE DRAWINGS

FIGS. 3A to 3C are a top view and cross-sectional views illustrating an example of a semiconductor device according to one embodiment of the present invention.

FIGS. 4A to 4C are a top view and cross-sectional views illustrating an example of a semiconductor device according to one embodiment of the present invention.

DETAILED DESCRIPTION OF THE INVENTION

Figure 1A:
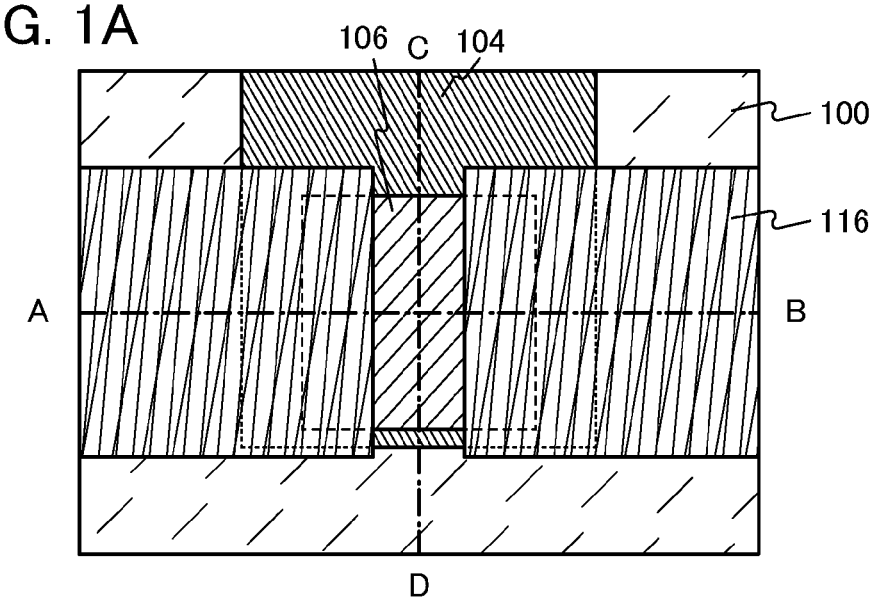
FIGS. 1A to 1C are a top view and cross-sectional views illustrating an example of a semiconductor device according to one embodiment of the present invention.

Hereinafter, embodiments of the present invention will be described in detail with reference to the accompanying drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments. In describing structures of the present invention with reference to the drawings, the same reference numerals are used in common for the same portions in different drawings. Note that the same hatch pattern is applied to similar parts, and the similar parts are not especially denoted by reference numerals in some cases.

Before the present invention is described, terms used in this specification will be briefly explained. First, when one of the source and the drain of a transistor is called a drain, the other is called a source in this specification. That is, they are not distinguished depending on the potential level. Therefore, a portion called a source in this specification can be alternatively referred to as a drain.

In addition, a voltage refers to a potential difference between a given potential and a reference potential (e.g., a ground potential) in many cases. Accordingly, voltage, potential and a potential difference can be referred to as potential, voltage, and a voltage difference, respectively.

Even when it is written in this specification that "to be connected", there is the case where no physical connection is made in an actual circuit and a wiring is only extended.

Note that the ordinal numbers such as "first" and "second" in this specification are used for convenience and do not denote the order of steps or the stacking order of layers. In addition, the ordinal numbers in this specification do not denote particular names which specify the present invention.

Embodiment 1

In this embodiment, an example of a transistor that is a semiconductor device of one embodiment of the present invention is described with reference to FIGS. 1A to 1C.

FIG. 1A is a top view of the transistor. A cross section along alternate long and short dash line A-B in FIG. 1A and a cross section along alternate long and short dash line C-D in FIG. 1A correspond to a cross section A-B in FIG. 1B and a cross section C-D in FIG. 1C, respectively.

Here, the cross section A-B in FIG. 1B will be described in detail.

The semiconductor device includes a substrate 100, a gate electrode 104 over the substrate 100, a gate insulating film 112 covering the substrate 100 and the gate electrode 104, a semiconductor film 106 over the gate electrode 104 with the gate insulating film 112 interposed therebetween, a pair of electrodes 116 which are over the oxide semiconductor film 106 and partly in contact with the oxide semiconductor film 106, and an interlayer insulating film 118 covering the gate insulating film 112, the semiconductor film 106, and the pair of electrodes 116.

The gate insulating film 112 includes a silicon oxide film having at least a negative fixed charge. Further, as the silicon oxide film having a negative fixed charge, instead of aluminum, an element belonging to Group 13 such as boron (B), gallium (Ga), or indium (In) may be contained in the silicon oxide film The silicon oxide film having a negative fixed charge refers to a silicon oxide film in which aluminum concentration is greater than or equal to 0.01 at. % and less than or equal to 10 at. %, preferably greater than or equal to 0.02 at. % and less than or equal to 5 at. %, more preferably greater than or equal to 0.05 at. % and less than or equal to 2 at. %. Aluminum generates a negative fixed charge in the silicon oxide film. The negative fixed charge in the silicon oxide film does not greatly increase even when the aluminum concentration in the silicon oxide film exceeds 10 at. %. However, the amount of oxygen released by heat treatment may be reduced in some cases when the aluminum concentration is too high. Further, it is possible to generate a negative fixed charge in the silicon oxide film when the aluminum concentration is less than or equal to 0.01 at. %; however it is not preferable in terms of controlling the threshold voltage because aluminum which is usually included in a silicon oxide target unintentionally is included in the range.

Here, the silicon oxide film having a negative fixed charge has a surface charge density on the semiconductor film 106 side of greater than or equal to $1\times10^{10}$ cm$^{-2}$ and less than or equal to $5\times10^{11}$ cm$^{-2}$, preferably greater than or equal to $1\times10^{11}$ cm$^{-2}$ and less than or equal to $3\times10^{11}$ cm$^{-2}$.

Aluminum in the silicon oxide film may be combined with part of oxygen included in the silicon oxide film, or may be included between lattices in the silicon oxide film.

The silicon oxide film including aluminum may be formed by a sputtering method using a silicon oxide target including aluminum of greater than of equal to 0.01 at. % and less than or equal to 10 at. %, preferably greater than of equal to 0.02 at. % and less than or equal to 5 at. %, further preferably greater than of equal to 0.05 at. % and less than or equal to 2 at. %, for example. Alternatively, the silicon oxide film including aluminum may be formed by a sputtering method using an aluminum oxide sintered body or an aluminum metal piece appropriately set over a silicon oxide target. Note that a silicon target may be used instead of the silicon oxide target. The amount of aluminum oxide sintered body or aluminum metal piece may be set so that the aluminum concentration in the silicon oxide film is greater than of equal to 0.01 at. % and less than or equal to 10 at. %, preferably greater than of equal to 0.02 at. % and less than or equal to 5 at. %, further preferably greater than of equal to 0.05 at. % and less than or equal to 2 at. % in response to film formation rates of the silicon oxide target, and aluminum oxide sintered body or aluminum metal piece. Further alternatively, the silicon oxide film may be formed by a multi-source sputtering method using a silicon oxide target and an aluminum oxide target. In the case where the multi-source sputtering method is employed, film formation conditions may be selected such that film formation rates are adjusted by electric power applied to the silicon oxide target and the aluminum oxide target and the aluminum concentration is within the above-described range.

The film formation method of the silicon oxide film including aluminum is not limited to a sputtering method, and a pulse laser deposition method, a plasma CVD method, a molecular beam epitaxy method, or the like may be employed.

For example, when aluminum is added to the silicon oxide film by an ion doping method, an ion implantation method, or the like, damage is caused in the silicon oxide film at the same time when aluminum is added. Thus, the damaged silicon oxide film is not appropriate as the film in contact with an active layer of a transistor. More specifically, the damaged silicon oxide film including many defects deteriorates electric characteristics of the transistor and reduces reliability of the transistor. If the defects of the silicon oxide film are to be repaired, an unnecessary process such as high-temperature heat treatment is required. Thus, it is preferable to form the silicon oxide film including aluminum during the film formation by a sputtering method, a pulse laser deposition method, or the like because aluminum can be added without damaging the silicon oxide film.

Further, nitrogen, a rare gas (such as helium, neon, argon, krypton, and xenon), or carbon, the content of which is greater than or equal to 0.01 at. % and less than or equal to 5 at. %, may be included in the silicon oxide film including aluminum.

Further, the gate insulating film 112 may have a single layer structure or a stacked structure of a silicon oxide film having a negative fixed charge. When the gate insulating film 112 has a stacked structure, a combination of the silicon oxide film having a negative fixed charge and a silicon oxide film (except a silicon oxide film which intentionally includes a negative fixed charge), a silicon nitride film, an aluminum oxide film, a hafnium oxide film, an yttrium oxide film, a zirconium oxide, or the like can be used. The above-described film may be formed by a thermal oxidation method, a CVD method (such as a plasma CVD method or a thermal CVD method), a sputtering method, or the like, for example. When the gate insulating film 112 has a stacked structure, the silicon oxide film having a negative fixed charge may be provided to be in contact with the semiconductor film 106, or the silicon oxide film having a negative fixed charge may be provided with another insulating film interposed between the silicon oxide film having a negative fixed charge and the semiconductor film 106.

Further, it is preferable that the interlayer insulating film 118 include a silicon oxide film having at least a negative fixed charge. Similarly to the gate insulating film 112, the interlayer insulating film 118 may also have a single layer structure or a stacked structure of a silicon oxide film having a negative fixed charge. When the interlayer insulating film 118 have a stacked structure, a combination of the silicon oxide film having a negative fixed charge and a silicon nitride film, an aluminum oxide film, a hafnium oxide film, an yttrium oxide film, a zirconium oxide, or the like can be used. The above-described film may be formed by a thermal oxidation method, a CVD method (such as a plasma CVD method or a thermal CVD method), a sputtering method, or the like, for example. When the interlayer insulating film 118 has a stacked structure, the silicon oxide film having a negative fixed charge may be provided to be in contact with the semiconductor film 106, or the silicon oxide film having a negative fixed charge may be provided with another insulating film interposed between the silicon oxide film having a negative fixed charge and the semiconductor film 106.

Note that the silicon oxide film having a negative fixed charge may be included in either or both of the gate insulating film 112 and the interlayer insulating film 118. For example, when the silicon oxide film having a negative fixed charge is included in the interlayer insulating film 118, another insulating film may be used as the gate insulating film 112.

By using the silicon oxide film having a negative fixed charge as either or both of the gate insulating film 112 and the interlayer insulating film 118, a negative electric field is always applied to a channel region due to the negative fixed charge. Thus, high voltage needs to be applied to a gate for forming a channel. Accordingly, the threshold voltage can be shifted in the positive direction.

When the semiconductor film 106 is an oxide semiconductor film, a film from which oxygen is released by heat treatment is preferably used as either or both of the gate insulating film 112 and the interlayer insulating film 118. With use of such a film from which oxygen is released by heat treatment, defects generated in the semiconductor film 106 can be repaired and electric characteristics of the transistor can be inhibited from being degraded. In addition, the silicon oxide film having a negative fixed charge may also serves as the film from which oxygen is released by heat treatment, or a film from which oxygen is released by heat treatment may be provided in addition to the silicon oxide film having a negative fixed charge.

In this specification, and the like, to release oxygen by heat treatment means that the amount of released oxygen which is converted to oxygen atoms is greater than or equal to $1.0 \times 10^{18}$ cm$^{-3}$, preferably greater than or equal to $1.0 \times 10^{20}$ cm$^{-3}$, in thermal desorption spectroscopy (TDS) analysis.

Here, a method in which the amount of released oxygen is measured by being converted into oxygen atoms using TDS analysis is described.

The amount of released gas in TDS analysis is proportional to the integral value of ion intensity. Therefore, the amount of released gas can be calculated from the ratio between the integral value of measured ion intensity and the reference value of a standard sample. The reference value of a standard sample refers to the ratio of the density of a predetermined atom contained in a sample to the integral value of ion intensity.

For example, the number of the released oxygen molecules ($N_{O2}$) from an insulating film can be found according to a Formula 1 with the TDS analysis results of a silicon wafer containing hydrogen at a predetermined density which is the standard sample and the TDS analysis results of the insulating film. Here, all gases having a mass number of 32 which are obtained by the TDS analysis are assumed to originate from an oxygen molecule. CH$_3$OH, which is given as a gas having a mass number of 32, is not taken into consideration on the assumption that it is unlikely to be present. Further, an oxygen molecule including an oxygen atom having a mass number of 17 or 18 which is an isotope of an oxygen atom is also not taken into consideration because the proportion of such a molecule in the natural world is minimal $$N_{O2} = N_{H2}/S_{H2} \times S_{O2} \times \alpha \quad \text{[Formula 1]}$$

$N_{H2}$ is the value obtained by conversion of the number of hydrogen molecules desorbed from the standard sample into densities. $S_{H2}$ is the integral value of ion intensity when the standard sample is subjected to TDS analysis. Here, the reference value of the standard sample is set to $N_{H2}/S_{H2}$. $S_{O2}$ is the integral value of ion intensity when the insulating film is subjected to TDS analysis. $\alpha$ is a coefficient which influences ion intensity in TDS analysis. Refer to Japanese Published Patent Application No. H06-275697 for details of Formula 1. Note that the amount of released oxygen from the insulating film is measured with a thermal desorption spectroscopy apparatus produced by ESCO Ltd., EMD-WA1000S/W using a silicon wafer containing hydrogen atoms at $1 \times 10^{16}$ cm$^{-3}$ as the standard sample.

Further, in the TDS analysis, oxygen is partly detected as an oxygen atom. The ratio between oxygen molecules and oxygen atoms can be calculated from the ionization rate of the oxygen molecules. Note that, since the above $\alpha$ includes the ionization rate of the oxygen molecules, the number of the released oxygen atoms can also be estimated through the evaluation of the number of the released oxygen molecules.

Note that $N_{O2}$ is the number of the released oxygen molecules. The amount of released oxygen when converted into oxygen atoms is twice the number of the released oxygen molecules.

In the above structure, the film from which oxygen is released by heat treatment may be oxygen-excess silicon oxide ($SiO_X$ (X>2)). In the oxygen-excess silicon oxide ($SiO_X$ (X>2)), the number of oxygen atoms per unit volume is more than twice the number of silicon atoms per unit volume. The number of silicon atoms and the number of oxygen atoms per unit volume are measured by Rutherford backscattering spectrometry (RBS).

When oxygen is supplied to the semiconductor film 106, which is an oxide semiconductor film, from either or both of the gate insulating film 112 and the interlayer insulating film 118, one or both of the interface state density between the semiconductor film 106 and the gate insulating film 112 and the interface state density between the semiconductor film 106 and the interlayer insulating film 118 can be reduced. As a result, carrier trapping at either or both of the interface between the semiconductor film 106 and the gate insulating film 112, and the interface between the semiconductor film 106 and the interlayer insulating film 118 can be suppressed, and thus a transistor with less degradation in electric characteristics can be obtained.

Further, in some cases, charge is generated due to oxygen deficiency in the oxide semiconductor film. In general, part of oxygen vacancy in an oxide semiconductor film serves as a donor and causes release of an electron which is a carrier. As a result, the threshold voltage of a transistor shifts in the negative direction. Oxygen is sufficiently supplied from the gate insulating film 112 or the interlayer insulating film 118 to the semiconductor film 106, whereby the oxygen vacancy in the oxide semiconductor film, which causes the negative shift of the threshold voltage, can be reduced.

In other words, a film from which oxygen is released by heat treatment is provided for the gate insulating film 112 or the interlayer insulating film 118, the interface state density at an interface between the semiconductor film 106 and the gate insulating film 112 or the interface state density at an interface between the semiconductor film 106 and the interlayer insulating film 118 and the oxygen vacancy density in the semiconductor film 106 that is an oxide semiconductor film can be reduced. Thus, the influence of carrier trapping at the interface between the semiconductor film 106 that is an oxide semiconductor film and the gate insulating film 112 or at the interface between the semiconductor film 106 and the interlayer insulating film 118 can be reduced.

It is further preferable that the silicon oxide film having a negative fixed charge be provided in contact with the semiconductor film 106 or in the vicinity of the semiconductor film 106 so that the cause of the negative shift of the threshold voltage of the semiconductor film 106 is eliminated.

There is no particular limitation on the substrate 100 as long as it has heat resistance enough to withstand at least heat treatment performed later. For example, a glass substrate, a ceramic substrate, a quartz substrate, or a sapphire substrate may be used as the substrate 100. Alternatively, a single crystal semiconductor substrate or a polycrystalline semiconductor substrate made of silicon, silicon carbide, or the like, a compound semiconductor substrate made of silicon germanium or the like, a silicon-on-insulator (SOI) substrate, or the like may be used as the substrate 100. Still alternatively, any of these substrates further provided with a semiconductor element may be used as the substrate 100.

Further alternatively, a flexible substrate may be used as the substrate 100. In that case, a transistor may be directly formed on the flexible substrate. As a method for forming a transistor on a flexible substrate, a method may be employed in which after the transistor is formed over a non-flexible substrate, the transistor is separated and transferred to the substrate 100 that is a flexible substrate. In that case, a separation layer is preferably provided between the non-flexible substrate and the transistor.

The gate electrode 104 may be formed to have a single layer structure or a stacked structure, using at least one of the following materials: Al, Ti, Cr, Co, Ni, Cu, Y, Zr, Mo, Ag, Ta, and W; a nitride of any of these elements; an oxide of any of these elements; and an alloy of any of these elements. In the case of using an oxide film for the gate electrode 104, the oxide may contain nitrogen at higher than or equal to $5 \times 10^{19}$ $cm^{-3}$ and lower than or equal to 20 at. %, preferably higher than or equal to $1 \times 10^{20}$ $cm^{-3}$ and lower than or equal to 7 at. %. For example, an oxide film which contains nitrogen at higher than or equal to $1 \times 10^{20}$ $cm^{-3}$ and lower than or equal to 7 at. % and also contains In, Ga, and Zn may be used. Since an oxide film has higher resistance than a metal film, in the case of using an oxide film as the gate electrode 104, it is preferable to use a stacked structure of the oxide film and a low-resistance film with a sheet resistance of 10 Ω/sq or lower in order to reduce resistance of the whole gate electrode 104. Note that the concentration in the unit of $cm^{-3}$ can be quantified by the secondary ion mass spectroscopy (SIMS) analysis, and the concentration in the unit of at. % can be quantified by X-ray photoelectron spectroscopy (XPS) analysis.

Figure 1B:
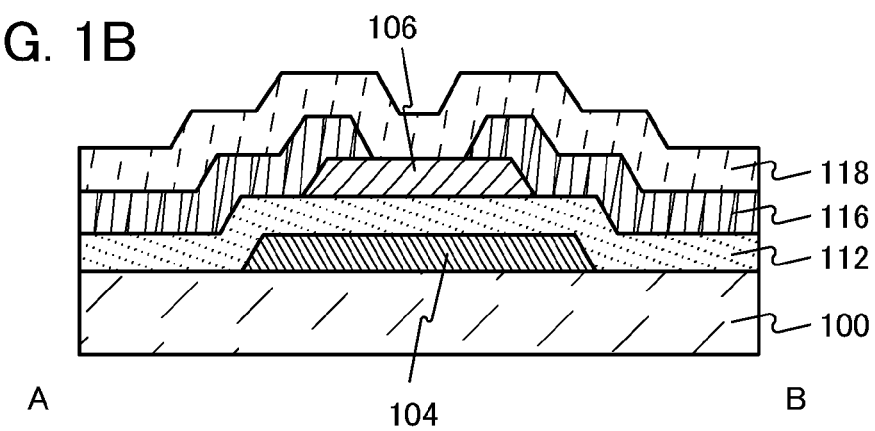
Figure 1C:
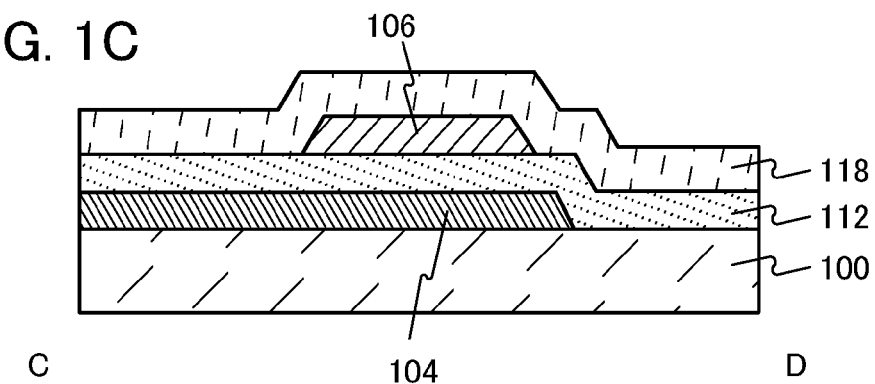

In FIGS. 1A to 1C, the gate electrode 104 is larger than the semiconductor film 106 in length and width, so that degradation and generation of electric charge due to light are suppressed in the semiconductor film 106; however, the present invention is not limited to this structure. The semiconductor film 106 may be larger than the gate electrode 104 in length and width in the top view.

When an oxide semiconductor film is used as the semiconductor film 106, a sputtering method, a plasma CVD method, a pulse laser deposition (PLD) method, a molecular beam epitaxy (MBE) method, an evaporation method, or the like may be employed, and a material containing two or more kinds of elements selected from In, Ga, Zn, and Sn may be used.

For example, for the oxide semiconductor film, a four-component metal oxide such as an In—Sn—Ga—Zn—O-based material; a three-component metal oxide such as an In—Ga—Zn—O-based material, an In—Sn—Zn—O-based material, an In—Al—Zn—O-based material, a Sn—Ga—Zn—O-based material, an Al—Ga—Zn—O-based material, or a Sn—Al—Zn—O-based material; a two-component metal oxide such as an In—Zn—O-based material, a Sn—Zn—O-based material, an Al—Zn—O-based material, a Zn—Mg—O-based material, a Sn—Mg—O-based material, an In—Mg—O-based material, or an In—Ga—O-based material; an In—O-based material; a Sn—O-based material; a Zn—O-based material; or the like may be used. Here, for example, an In—Ga—Zn—O-based material means oxide containing indium (In), gallium (Ga), and zinc (Zn), and there is no particular limitation on the composition ratio. Further, the In—Ga—Zn—O-based oxide semiconductor may contain an element other than In, Ga, and Zn. At this time, the amount of oxygen is preferably in excess of stoichiometry in the oxide semiconductor film. When the amount of oxygen is in excess of stoichiometry, generation of carriers which results from oxygen deficiency in the oxide semiconductor film can be suppressed.

For example, in the case where an In—Zn—O-based material is used for the oxide semiconductor film, the atomic ratio is set so that In/Zn is in greater than or equal to 0.5 and less than or equal to 50, preferably greater than or equal to 1 and less than or equal to 20, more preferably greater than or equal to 3 and less than or equal to 30. When the atomic ratio of Zn is in the above range, the field effect mobility of the transistor can be improved. Here, when the atomic ratio of the compound is In:Zn:O=X:Y:Z, the relation of Z>1.5X+Y is preferably satisfied.

Alternatively, a material represented by a chemical formula, $InMO_3(ZnO)_m$ (m>0) may be used as the oxide semiconductor film. Here, M represents one or more metal elements selected from Ga, Al, Mn, and Co. For example, M may be Ga, Ga and Al, Ga and Mn, Ga and Co, or the like.

A material whose band gap is 2.5 eV or more, preferably 3.0 eV or more, is used for the oxide semiconductor film in order to reduce the off-state current of the transistor. Instead of the oxide semiconductor film, a material having semiconductor characteristics whose band gap is in the above-described range may also be used.

In the above-described oxide semiconductor film, hydrogen, an alkali metal, an alkaline earth metal, and the like are reduced and the concentration of impurities is very low. Therefore, in a transistor whose channel region is formed using an oxide semiconductor film, off-state current can be reduced.

The concentration of hydrogen contained in the oxide semiconductor film is lower than $5 \times 10^{18}$ $cm^{-3}$, preferably lower than or equal to $1 \times 10^{18}$ $cm^{-3}$, more preferably lower than or equal to $5 \times 10^{17}$ $cm^{-3}$, still more preferably lower than or equal to $1 \times 10^{16}$ $cm^{-3}$.

An alkali metal is not an element included in an oxide semiconductor, and therefore, is an impurity. Also, an alkaline earth metal is also an impurity in the case where the alkaline earth metal is not included in an oxide semiconductor. An alkali metal, in particular, Na becomes $Na^+$ when an insulating film in contact with the oxide semiconductor film is an oxide film and Na diffuses into the insulating layer. In addition, in the oxide semiconductor film, Na cuts or enters a bond between a metal and oxygen which are included in the oxide semiconductor. As a result, for example, deterioration of characteristics of the transistor such as a normally-on state of the transistor due to shift of a threshold voltage in the negative direction or a reduction in field-effect mobility occurs; in addition, variation in characteristics is also caused. Such deterioration of characteristics of the transistor and variation in characteristics due to the impurity remarkably appear when the concentration of hydrogen in the oxide semiconductor film is sufficiently low. Therefore, when the concentration of hydrogen in the oxide semiconductor film is less than or equal to $1\times10^{18}$ cm$^{-3}$, preferably less than or equal to $1\times10^{17}$ cm$^{-3}$, the concentration of impurity is preferably reduced. Specifically, the measurement value of Na concentration is preferably lower than or equal to $5\times10^{15}$ cm$^{-3}$, more preferably lower than or equal to $1\times10^{15}$ cm$^{-3}$. In addition, the measurement value of lithium (Li) concentration is preferably $5\times10^{15}$ cm$^{-3}$ or less, more preferably $1\times10^{15}$ cm$^{-3}$ or less. In addition, the measurement value of potassium (K) concentration is preferably less than or equal to $5\times10^{15}$ cm$^{-3}$, more preferably less than or equal to $1\times10^{15}$ cm$^{-3}$.

With the use of the above-described oxide semiconductor film as the semiconductor film 106, off-state current of a transistor can be reduced. In particular, the off-state current of the transistor can be less than or equal to $1\times10^{-18}$ A, less than or equal to $1\times10^{-21}$ A, or less than or equal to $1\times10^{-24}$ A.

The oxide semiconductor film is in a single crystal state, a polycrystalline (also referred to as polycrystal) state, an amorphous state, or the like.

The oxide semiconductor film is preferably a CAAC-OS (c-axis aligned crystalline oxide semiconductor) film.

The CAAC-OS film is not completely single crystal nor completely amorphous. The CAAC-OS film is an oxide semiconductor film with a crystal-amorphous mixed phase structure where crystal parts and amorphous parts are included in an amorphous phase. Note that in most cases, the crystal parts fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of the c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

With use of the CAAC-OS film in a transistor, change in electric characteristics of the transistor due to irradiation with visible light or ultraviolet light can be reduced. Thus, the transistor has high reliability.

Note that part of oxygen included in the oxide semiconductor film may be substituted with nitrogen.

The case of using an oxide semiconductor as the semiconductor film 106 is described; however, a compound semiconductor such as silicon carbide or gallium nitride, which has a wider band gap than a silicon semiconductor and has a lower intrinsic carrier density than silicon may be used.

The pair of electrodes 116 may be formed with a single layer structure or a stacked structure using a metal film, a metal nitride film, a metal oxide film, an alloy film, or the like given for the gate electrode 104.

When a film including Cu is used for the pair of electrodes 116, the wiring resistance can be reduced, and wiring delay or the like can be prevented even in a large-sized display device or the like. In the case of using Cu for the pair of electrodes 116, the adhesion depends on the material of the substrate 100; in such a case, it is preferable to employ a stacked structure using a film having favorable adhesion property to the substrate 100. As the film having favorable adhesion property to the substrate 100, a film including Ti, Mo, Mn, Cu, or Al may be used. For example, a Cu—Mn—Al alloy may be used.

As described above, with the use of the silicon oxide film having a negative fixed charge as a film in contact with the semiconductor film 106 or a film in the vicinity of the semiconductor film 106, a negative electric field is always applied to a channel region due to the negative fixed charge. Thus, the threshold voltage of the transistor can be shifted in the positive direction. Accordingly, a highly reliable semiconductor device can be manufactured by giving stable electric characteristics to a transistor.

This embodiment can be implemented in appropriate combination with the other embodiments.

Embodiment 2

In this embodiment, a transistor having a structure different from that of the transistor described in Embodiments 1 will be described.

Figure 2A:
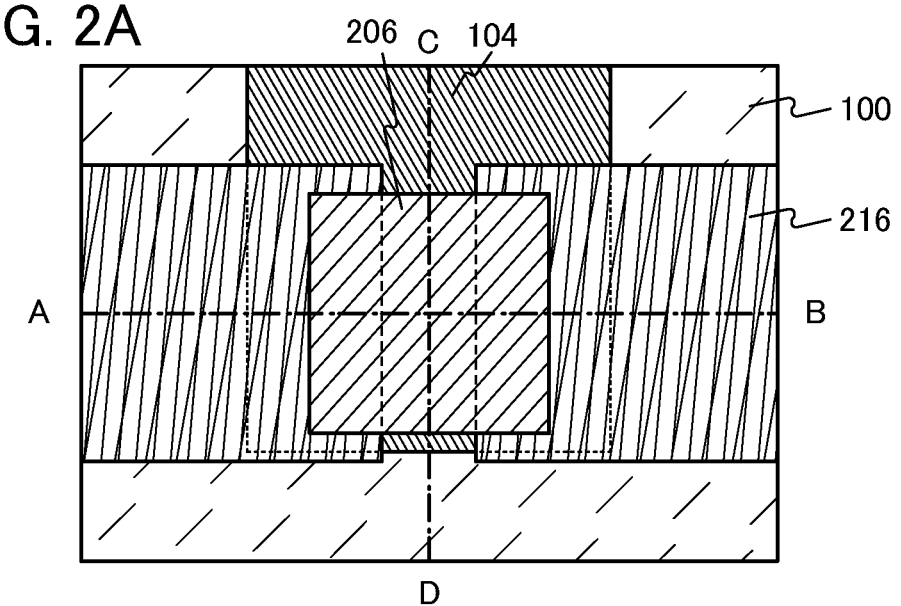
FIGS. 2A to 2C are a top view and cross-sectional views illustrating an example of a semiconductor device according to one embodiment of the present invention.
Figure 2B:
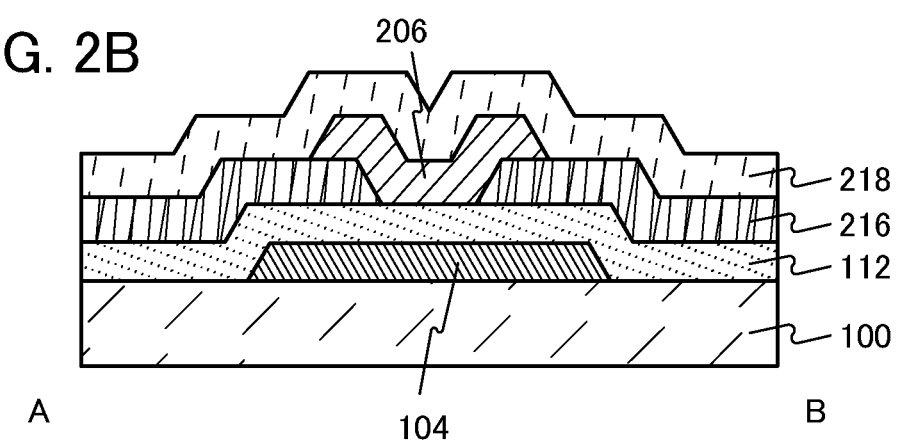
Figure 2C:
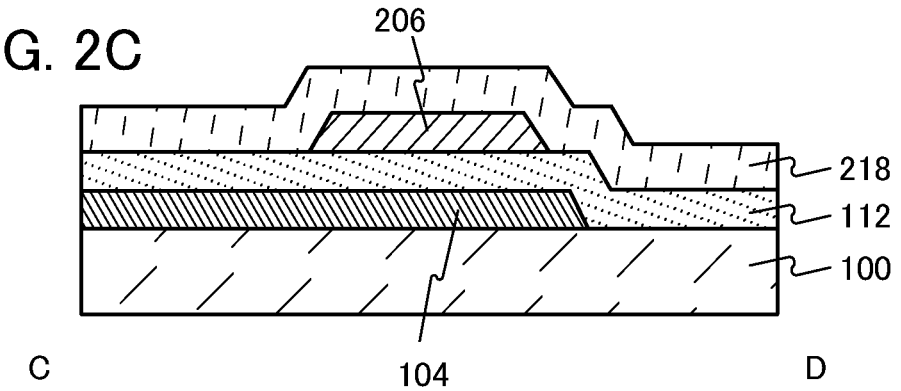

FIGS. 2A to 2C are a top view and cross-sectional views of a transistor that is one embodiment of the present invention. A cross section along alternate long and short dash line A-B in FIG. 2A and a cross section along alternate long and short dash line C-D in FIG. 2A correspond to a cross section A-B in FIG. 2B and a cross section C-D in FIG. 2C, respectively.

The cross section A-B in FIG. 2B will be described in detail below.

The semiconductor device includes the substrate 100, the gate electrode 104 over the substrate 100, the gate insulating film 112 covering the substrate 100 and the gate electrode 104, a pair of electrodes 216 over the gate insulating film 112, a semiconductor film 206 which is over the gate electrode 104 with the gate insulating film 112 interposed therebetween and partly in contact with the pair of electrodes 216, and an interlayer insulating film 218 covering the gate insulating film 112, and the pair of electrodes 216, and the semiconductor film 206. Here, the pair of electrodes 216, the semiconductor film 206, and the interlayer insulating film 218 may have structures similar to those of the pair of electrodes 116, the semiconductor film 106, and the interlayer insulating film 118, respectively, described in Embodiment 1.

By using a silicon oxide film having a negative fixed charge as either or both of the gate insulating film 112 and the interlayer insulating film 218, a negative electric field is always applied to a channel region due to the negative fixed charge. Thus, the threshold voltage of the transistor can be shifted in the positive direction. Accordingly, a highly reliable semiconductor device can be manufactured by giving stable electric characteristics to a transistor.

A film from which oxygen is released by heat treatment is used as either or both of the gate insulating film 112 and the interlayer insulating film 118. With use of the film from which oxygen is released by heat treatment, defects generated in the semiconductor film 106 can be repaired and electric characteristics of the transistor can be inhibited from being degraded. The silicon oxide film having a negative fixed charge may also serves as the film from which oxygen is released by heat treatment, or a film from which oxygen is released by heat treatment may be provided in addition to the silicon oxide film having a negative fixed charge.

FIGS. 3A to 3C are a top view and cross-sectional views of a transistor which is a semiconductor device of one embodiment of the present invention. A cross section along alternate long and short dash line A-B in FIG. 3A and a cross section along alternate long and short dash line C-D in FIG. 3A correspond to a cross section A-B in FIG. 3B and a cross section C-D in FIG. 3C, respectively.

The cross section A-B in FIG. 3B will be described in detail below.

The semiconductor device includes the substrate 100, a base insulating film 302 over the substrate 100, a semiconductor film 306 over the base insulating film 302, a pair of electrodes 316 which are over the semiconductor film 306 and partly in contact with the semiconductor film 306, a gate insulating film 312 covering the semiconductor film 306 and the pair of electrodes 316, and a gate electrode 304 over the semiconductor film 306 with the gate insulating film 112 interposed therebetween. Here, the pair of electrodes 316, the semiconductor film 306, the gate electrode 304, and the gate insulating film 312 may have structures similar to those of the pair of electrodes 116, the semiconductor film 106, the gate electrode 104, and the gate insulating film 112, respectively, described in Embodiment 1, The base insulating film 302 may have a single layer structure or a stacked structure using a silicon oxide film having a negative fixed charge. When the base insulating film 302 have a stacked structure, a combination of the silicon oxide film having a negative fixed charge, a silicon nitride film, an aluminum oxide film, a hafnium oxide film, an yttrium oxide film, a zirconium oxide, or the like can be used. The above-described film may be formed by a thermal oxidation method, a CVD method (such as a plasma CVD method or a thermal CVD method), a sputtering method, or the like, for example. When the gate insulating film 312 has a stacked structure, the silicon oxide film having a negative fixed charge may be provided to be in contact with the semiconductor film 306, or the silicon oxide film having a negative fixed charge may be provided with another insulating film interposed between the silicon oxide film and the semiconductor film 306.

By using a silicon oxide film having a negative fixed charge as either or both of the base insulating film 302 and the gate insulating film 312, a negative electric field is always applied to a channel region due to the negative fixed charge. Thus, the threshold voltage of the transistor can be shifted in the positive direction. Accordingly, a highly reliable semiconductor device can be manufactured by giving stable electric characteristics to a transistor.

A film from which oxygen is released by heat treatment is used as either or both of the base insulating film 302 and the gate insulating film 312. With use of the film from which oxygen is released by heat treatment, defects generated in the semiconductor film 306 can be repaired and electric characteristics of the transistor can be inhibited from being degraded. The silicon oxide film having a negative fixed charge may also serves as the film from which oxygen is released by heat treatment, or a film from which oxygen is released by heat treatment may be provided in addition to the silicon oxide film having a negative fixed charge.

FIGS. 4A to 4C are a top view and cross-sectional views of a transistor that is a semiconductor device of one embodiment of the present invention. A cross section along alternate long and short dash line A-B in FIG. 4A and a cross section along alternate long and short dash line C-D in FIG. 4A correspond to a cross section A-B in FIG. 4B and a cross section C-D in FIG. 4C, respectively.

The cross section A-B in FIG. 4B is described in detail below.

The semiconductor device includes the substrate 100, the base insulating film 302 over the substrate 100, a pair of electrodes 416 over the base insulating film 302, a semiconductor film 406 which is over the pair of electrodes 416 and partly in contact with the pair of electrodes 416, a gate insulating film 412 covering the semiconductor film 406 and the pair of electrodes 416, and a gate electrode 404 formed over the semiconductor film 406 with the gate insulating film 412 interposed therebetween. Here, the pair of electrodes 416, the semiconductor film 406, the gate electrode 404, and the gate insulating film 412 may have structures similar to those of the pair of electrodes 116, the semiconductor film 106, the gate electrode 104, and the gate insulating film 112, respectively, described in Embodiment 1, By using a silicon oxide film having a negative fixed charge, described in Embodiment 1, as either or both of the base insulating film 302 and the gate insulating film 412, a negative electric field is always applied to a channel region due to the negative fixed charge. Thus, the threshold voltage of the transistor can be shifted in the positive direction.

In FIGS. 4A to 4C, the gate electrode 404 is larger than the semiconductor film 406 in length and width, so that degradation and generation of electric charge due to light are suppressed in the semiconductor film 406; however, the present invention is not limited to this structure. The semiconductor film 406 may be larger than the gate electrode 404 in length and width in the top view. Note that the same can be said for the gate electrode 104 and the semiconductor film 206 illustrated in FIGS. 2A to 2C, and the gate electrode 304 and the semiconductor film 306 illustrated in FIGS. 3A to 3C FIGS. 5A to 5C are a top view and cross-sectional views of a transistor that is a semiconductor device of one embodiment of the present invention. A cross section along alternate long and short dash line A-B in FIG. 5A and a cross section along alternate long and short dash line C-D in FIG. 5A correspond to a cross section A-B in FIG. 5B and a cross section C-D in FIG. 5C, respectively.

Figure 5A:
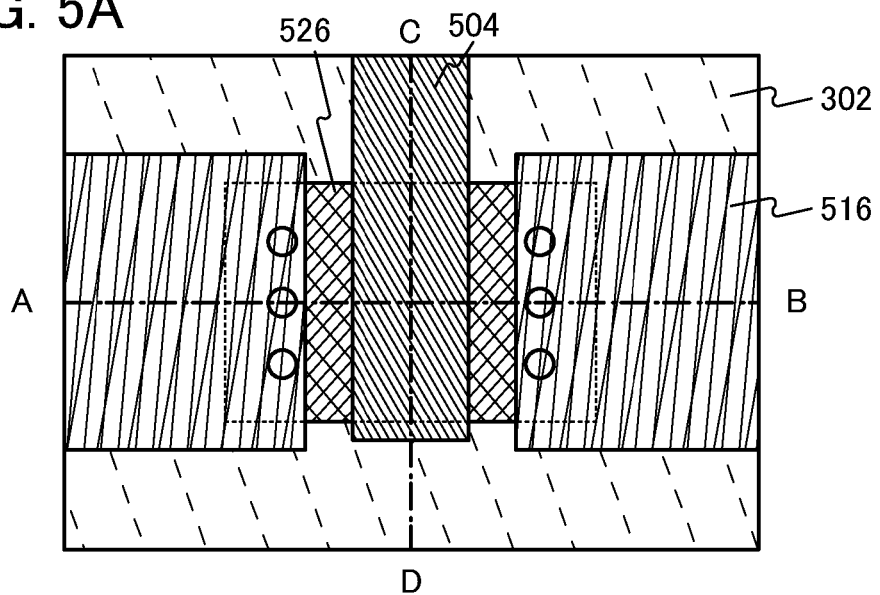
FIGS. 5A to 5C are a top view and cross-sectional views illustrating an example of a semiconductor device according to one embodiment of the present invention.
Figure 5B:
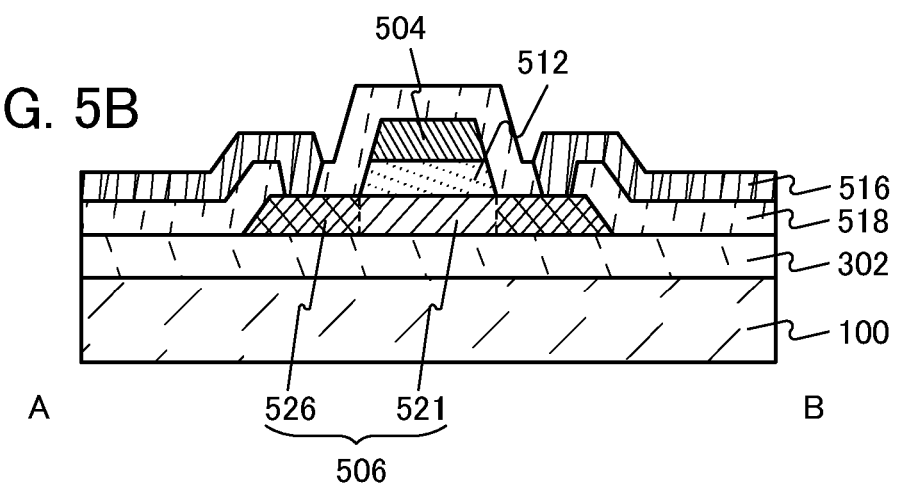
Figure 5C:
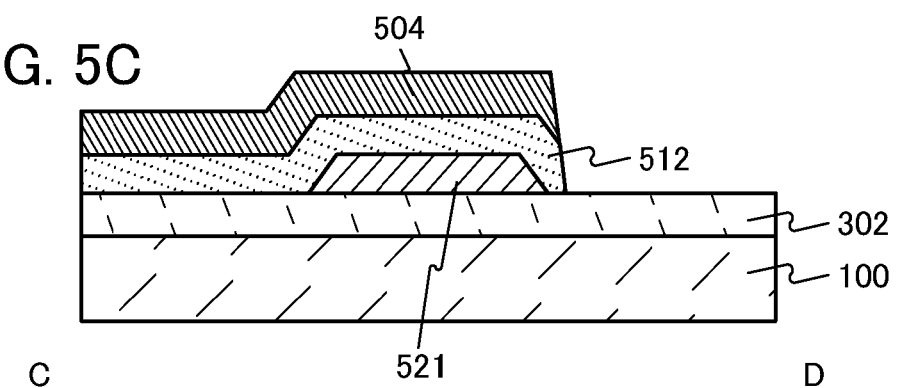

The cross section A-B in FIG. 5B will be described in detail below.

The semiconductor device includes the substrate 100, the base insulating film 302 over the substrate 100, a semiconductor film 506 having a region 526 and a region 521 over the base insulating film 302, a gate insulating film 512 over the region 521, a gate electrode 504 over the gate insulating film 512, an interlayer insulating film 518 covering the base insulating film 302, the region 526, the gate insulating film 512, and the gate electrode 504, and a pair of electrodes 516 in contact with the region 526 through an opening which is formed in the interlayer insulating film 518 to expose the region 526. Here, the pair of electrodes 516, the semiconductor film 506, the gate electrode 504, the interlayer insulating film 518, and the gate insulating film 512 may have structures similar to those of the pair of electrodes 116, the semiconductor film 106, the gate electrode 104, the interlayer insulating film 118, and the gate insulating film 112, respectively, described in Embodiment 1, By using the silicon oxide film having a negative fixed charge as either or both of the base insulating film 302 and the gate insulating film 512, a negative electric field is always applied to a channel region due to the negative fixed charge. Thus, the threshold voltage of the transistor can be shifted in the positive direction. Accordingly, a highly reliable semiconductor device can be manufactured by giving stable electric characteristics to a transistor.

A film from which oxygen is released by heat treatment is used as either or both of the base insulating film 302 and the gate insulating film 512. With use of the film from which oxygen is released by heat treatment, defects generated in the semiconductor film 506 can be repaired and electric characteristics of the transistor can be inhibited from being degraded. The silicon oxide film having a negative fixed charge may also serves as the film from which oxygen is released by heat treatment, or a film from which oxygen is released by heat treatment may be provided in addition to the silicon oxide film having a negative fixed charge.

The gate insulating film 512 and the gate electrode 504 may have substantially the same shape seen from the top surface. The shape can be obtained by processing the gate electrode 504 and the gate insulating film 512 together with use of one mask. Note that after formation of the gate electrode 504 and the gate insulating film 512, the width of the gate electrode 504 may be narrowed by performing plasma treatment or chemical treatment.

Although not illustrated, a structure in which the gate insulating film 512 covers the semiconductor film 506 may also be employed.

The region 521 may have substantially the same shape as the gate insulating film 512 or the gate electrode 504 when seen from the top surface. The shape is obtained by forming the region 526 of the semiconductor film 606 with use of the gate insulating film 512 or the gate electrode 504 as a mask. For example, with use of the gate insulating film 512 or the gate electrode 504 as a mask, an impurity that directly or indirectly generates a carrier (such as boron, phosphorus, hydrogen, a rare gas, or nitrogen) is introduced to the semiconductor film 506, so that a region whose resistance is reduced is formed. The thus formed region can be the region 526. Note that the region 521 is a region other than the region 526 in the semiconductor film 506.

The region 521 functions as a channel region of the transistor. Further, the region 526 has a function as a source region or a drain region of the transistor.

Figure 6A:
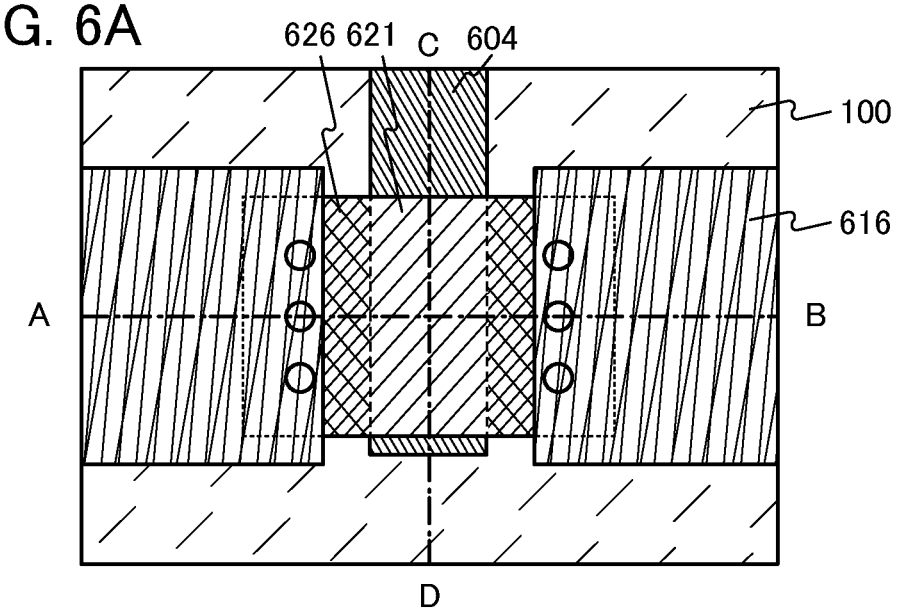
FIGS. 6A to 6C are a top view and cross-sectional views illustrating an example of a semiconductor device according to one embodiment of the present invention.
Figure 6B:
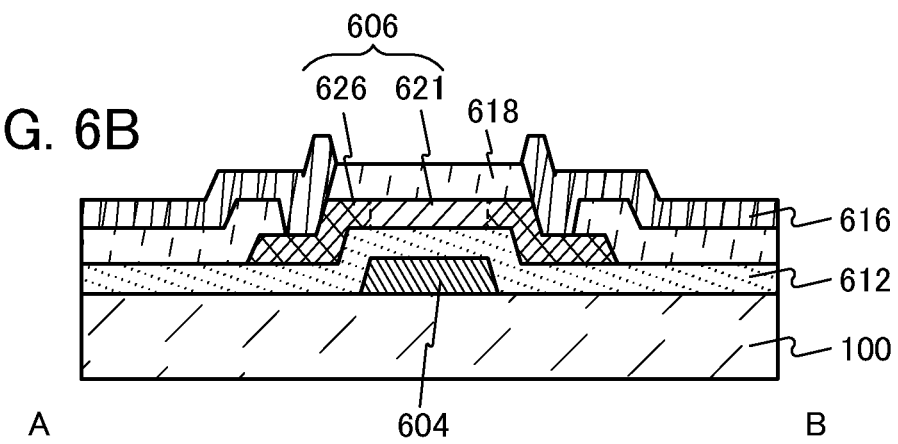
Figure 6C:
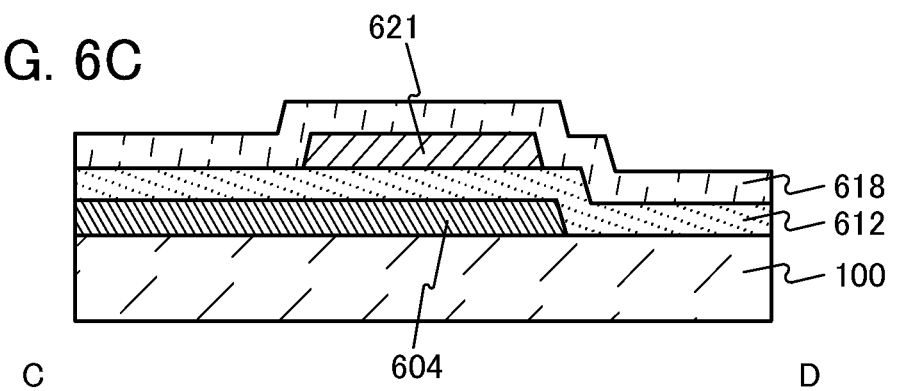

FIGS. 6A to 6C are a top view and cross-sectional views of a transistor that is a semiconductor device of one embodiment of the present invention. A cross section along alternate long and short dash line A-B in FIG. 6A and a cross section along alternate long and short dash line C-D in FIG. 6A correspond to a cross section A-B in FIG. 6B and a cross section C-D in FIG. 6C, respectively.

The cross section A-B in FIG. 6B will be described in detail below.

The semiconductor device includes the substrate 100, a gate electrode 604 over the substrate 100, a gate insulating film 612 over the gate electrode 604, a semiconductor film 606 including a region 626 and a region 621 over the gate electrode 604 with the gate insulating film 612 interposed therebetween, an interlayer insulating film 618 covering the semiconductor film 606 and the gate insulating film 612, and a pair of electrodes 616 in contact with the region 626 through an opening which is formed in the interlayer insulating film 618 to expose the region 626. Here, the pair of electrodes 616, the semiconductor film 606, the gate electrode 604, the interlayer insulating film 618, and the gate insulating film 612 may have structures similar to those of the pair of electrodes 116, the semiconductor film 106, the gate electrode 104, the interlayer insulating film 118, and the gate insulating film 112, respectively, described in Embodiment 1. Further, the regions 621 and 626 may have structures similar to those of the regions 521 and 526.

By using a silicon oxide film having a negative fixed charge as either or both of the base insulating film 612 and the interlayer insulating film 618, a negative electric field is always applied to a channel region due to the negative fixed charge. Thus, the threshold voltage of the transistor can be shifted in the positive direction. Accordingly, a highly reliable semiconductor device can be manufactured by giving stable electric characteristics to a transistor.

A film from which oxygen is released by heat treatment is used as either or both of the gate insulating film 612 and the interlayer insulating film 618. With use of the film from which oxygen is released by heat treatment, defects generated in the semiconductor film 606 can be repaired and electric characteristics of the transistor can be inhibited from being degraded. The silicon oxide film having a negative fixed charge may also serves as the film from which oxygen is released by heat treatment, or a film from which oxygen is released by heat treatment may be provided in addition to the silicon oxide film having a negative fixed charge.

In FIGS. 6A to 6C, the gate insulating film 612, the gate electrode 604, and the region 621 have substantially the same shape seen from the top surface; however, they are not limited thereto. The gate insulating film 612, the gate electrode 604, and the region 621 may have different shapes from each other.

As described above, with the use of the silicon oxide film having a negative fixed charge as a film in contact with the semiconductor film 606 or a film in the vicinity of the semiconductor film 606, a negative electric field is always applied to a channel region due to the negative fixed charge. Thus, the threshold voltage of the transistor can be shifted in the positive direction. Accordingly, a highly reliable semiconductor device can be manufactured by giving stable electric characteristics to a transistor.

This embodiment can be implemented in appropriate combination with the other embodiments.

Embodiment 3

In this embodiment, a liquid crystal display device manufactured using the transistor described in Embodiment 1 or 2 will be described. Note that an example in which one embodiment of the present invention is applied to a liquid crystal display device will be described in this embodiment; however, the present invention is not limited to this embodiment. For example, application of one embodiment of the present invention to an electroluminescence (EL) display device is readily conceived by those skilled in the art.

Figure 7:
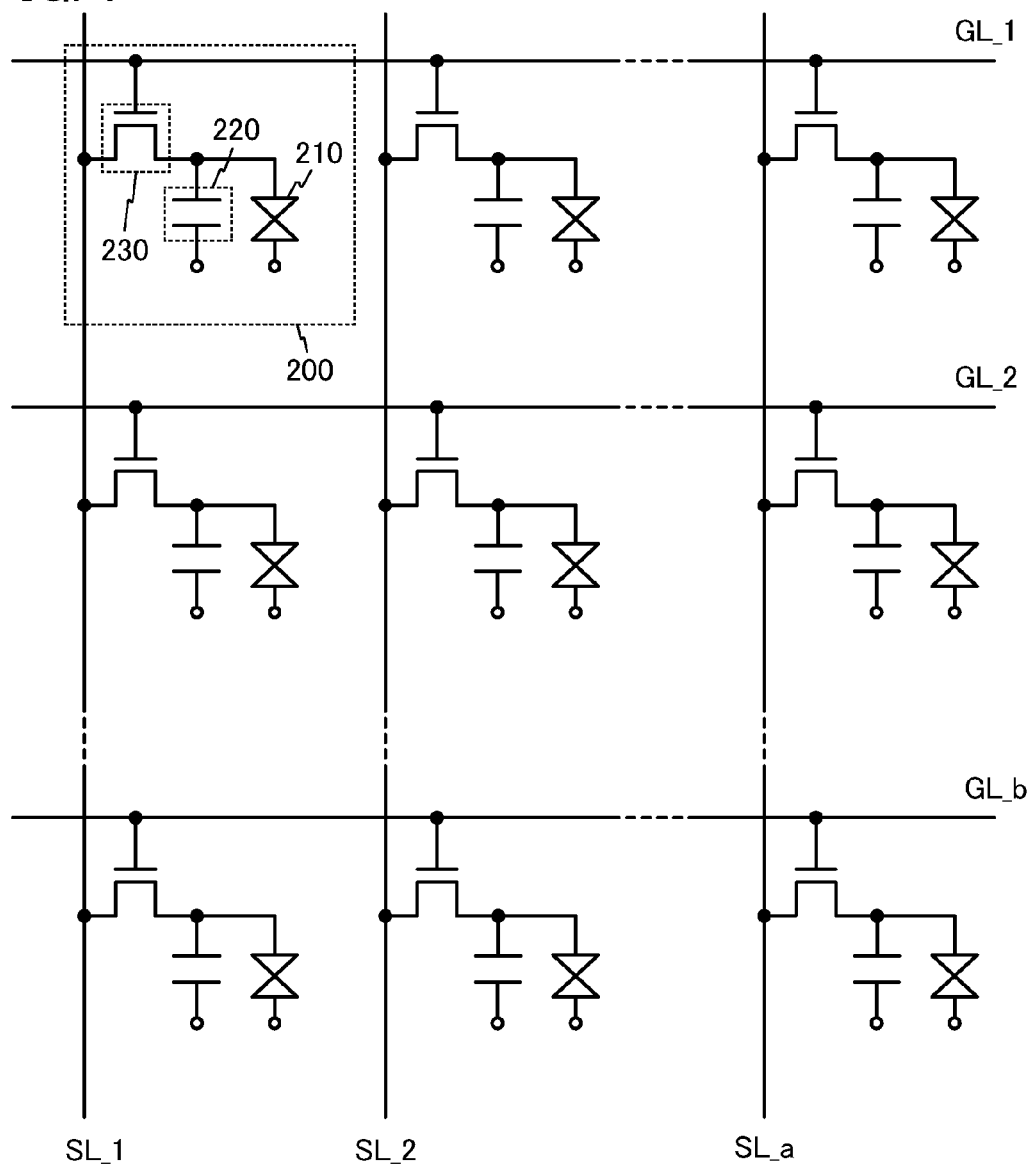
FIG. 7 is a circuit diagram illustrating an example of a liquid crystal display device including a transistor according to one embodiment of the present invention.

FIG. 7 is a circuit diagram of an active matrix liquid crystal display device. The liquid crystal display device includes source lines SL_1 to SL_a, gate lines GL_1 to GL_b, and a plurality of pixels 200. The pixels 200 each include a transistor 230, a capacitor 220, and a liquid crystal element 210. The plurality of pixels 200 with such a structure forms a pixel portion of the liquid crystal display device. In the case where the source line or the gate line is simply mentioned, it may be denoted as the source line SL or the gate line GL.

As the transistor 230, the transistor described in Embodiment 1 or Embodiment 2 is used. With use of the transistor which is one embodiment of the present invention, a display device with low power consumption, favorable electric characteristics, and high reliability can be obtained.

The gate line GL is connected to a gate of the transistor 230, the source line SL is connected to a source electrode of the transistor 230, and a drain electrode of the transistor 230 is connected to one capacitor electrode of the capacitor 220 and one pixel electrode of the liquid crystal element 210. The other capacitor electrode of the capacitor 220 and the other pixel electrode of the liquid crystal element 210 are connected to a common electrode. Note that the common electrode may be formed in the same layer as the gate line GL using the same material as the gate line GL.

Further, the gate line GL is connected to a gate driver circuit. The gate driver circuit may include the transistor described in Embodiment 1 or 2. Since the threshold voltage of the transistor is controlled, a voltage for turning on the transistor can be low. Thus, power consumption can be reduced.

The source line SL is connected to a source driver circuit. The source driver circuit may include the transistor described in Embodiment 2 or 3. Since the threshold voltage of the transistor is controlled, the off-state current of the transistor can be decreased and a voltage for turning on the transistor can be low. Thus, power consumption can be reduced.

Note that either or both of the gate driver circuit and the source driver circuit may be formed over a separately prepared substrate and connected using a method such as chip on glass (COG), wire bonding, or tape automated bonding (TAB).

Since a transistor is easily broken by static electricity or the like, a protection circuit is preferably provided. The protection circuit is preferably formed using a nonlinear element.

When a potential is applied to the gate line GL to be higher than or equal to the threshold voltage of the transistor 230, electric charge supplied from the source line SL flows as a drain current of the transistor 230 and is stored in the capacitor 220. After charging for one column is performed, the transistors 230 in the column are turned off, and the voltage is not given from the source line SL. However, the necessary voltage can be held by the electric charge stored in the capacitor 220. Then, the capacitors 220 in the next column are charged. In such a manner, charging for the first column to a-th column is performed.

In the case of using a transistor having a small off-state current as the transistor 230, the period for which the voltage can be kept can be lengthened. By this effect, the display rewriting frequency can be reduced in the case of displaying an image with little motion (including a still image); accordingly, further reduction of the power consumption is possible. Further, the capacitance of the capacitor 220 can be further reduced; accordingly, power consumed for charging can be reduced.

As described above, according to one embodiment of the present invention, a liquid crystal display device with high reliability and low power consumption can be obtained.

This embodiment can be implemented in appropriate combination with the other embodiments.

Embodiment 4

In this embodiment, an example of manufacturing a semiconductor memory device using the transistor described in Embodiment 1 or 2 will be described.

Typical examples of a volatile semiconductor memory device include a dynamic random access memory (DRAM) which stores data in such a manner that a transistor included in a memory element is selected and electric charge is accumulated in a capacitor, and a static random access memory (SRAM) which holds stored data using a circuit such as a flip-flop.

A typical example of a nonvolatile semiconductor memory device includes a flash memory which has a floating gate between a gate and a channel formation region of a transistor and stores data by holding electric charge in the floating gate.

The transistor described in Embodiment 1 or 2 can be applied to part of transistors included in the above-described semiconductor memory device.

First, a DRAM to which the transistor described in Embodiment 1 or 2 is applied will be described with reference to FIGS. 8A and 8B.

Figure 8A:
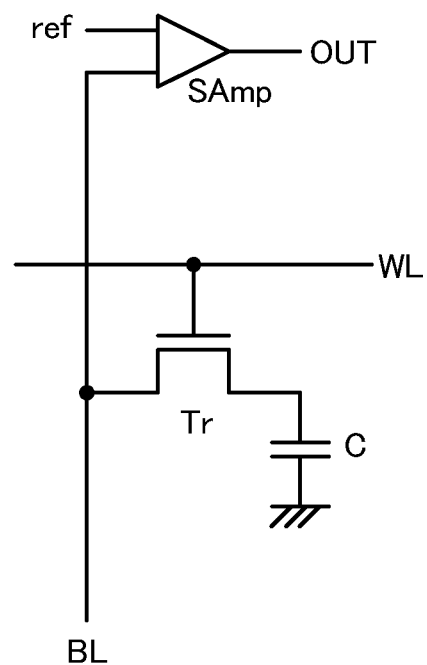
FIGS. 8A and 8B are a circuit diagram and a graph illustrating an example of a semiconductor memory device including a transistor according to one embodiment of the present invention.

The DRAM includes a bit line BL, a word line WL, a sense amplifier SAmp, a transistor Tr, and a capacitor C (see FIG. 8A).

Figure 8B:
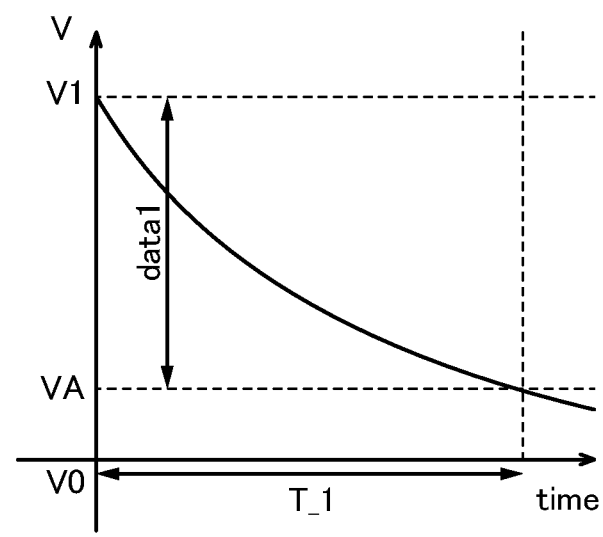

It is known that the voltage held in the capacitor is gradually decreased with time as shown in FIG. 8B owing to the off-state current of the transistor Tr. After a certain period of time, the voltage originally charged from V0 to V1 is decreased to VA which is a limit for reading data 1. This period is called a holding period T_1. In the case of a two-level DRAM, refresh needs to be performed within the holding period T_1.

When the transistor described in Embodiment 1 or Embodiment 2 is employed as the transistor Tr, the holding period T_1 can be made longer because the threshold voltage of the transistor is controlled and the off-state current is small. That is, a refresh period can be extended; thus, power consumption can be reduced. For example, when a DRAM is formed using a transistor in which a highly purified oxide semiconductor film is included and the off-state current is less than or equal to $1 \times 10^{-21}$ A, preferably less than or equal to $1 \times 10^{-24}$ A, data can be held for several days to several decades without supply of power.

As described above, using one embodiment of the present invention, a DRAM having high reliability and low power consumption can be provided.

Next, a nonvolatile memory to which the transistor described in Embodiment 1 or 2 is used will be described with reference to FIGS. 9A and 9B.

Figure 9A:
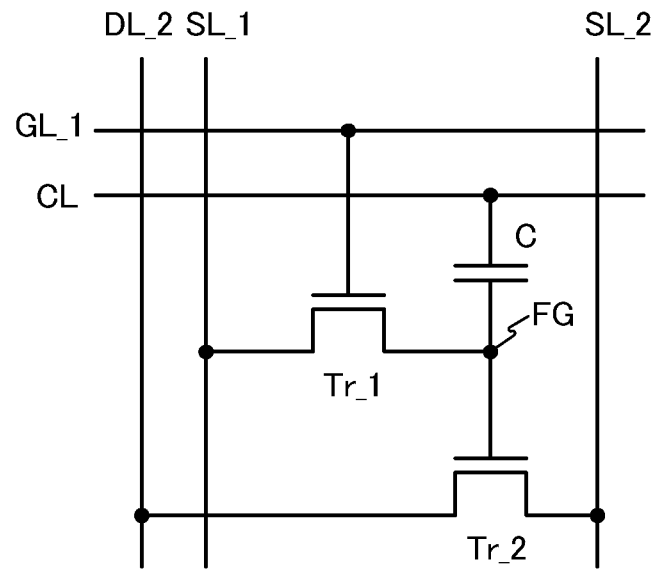
FIGS. 9A and 9B are a circuit diagram and a graph illustrating an example of a semiconductor memory device including a transistor according to one embodiment of the present invention.
Figure 9B:
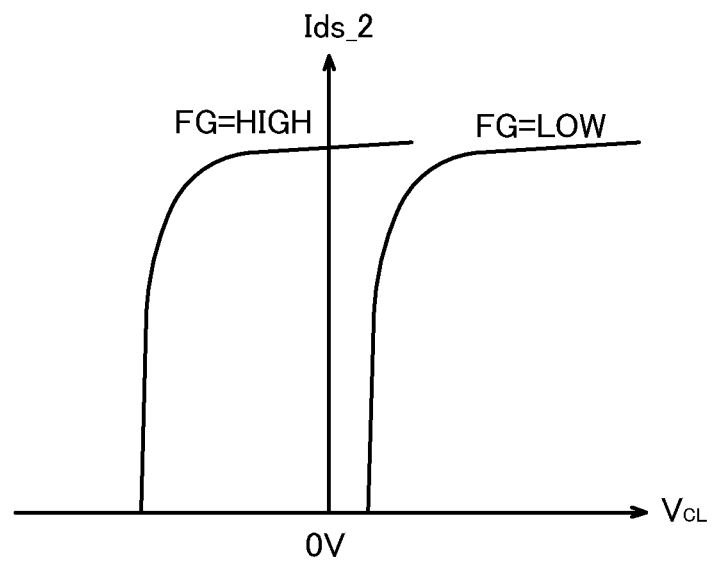

FIG. 9A is a circuit diagram of a NOR-type nonvolatile memory. The nonvolatile memory includes a transistor Tr_1, a gate line GL_1 connected to a gate of the transistor Tr_1, a source line SL_1 connected to a source of the transistor Tr_1, a transistor Tr_2, a source line SL_2 connected to a source of the transistor Tr_2, a drain line DL_2 connected to a drain of the transistor Tr_2, a capacitor C, a capacitor line CL connected to one of ends of the capacitor C, and a floating gate FG connected to the other end of the capacitor C, a drain of the transistor Tr_1, and a gate of the transistor Tr_2.

The nonvolatile memory described in this embodiment utilizes variation in the threshold voltage of the transistor Tr_2, which depends on the voltage of the floating gate FG. For example, FIG. 9B shows a relation between a potential $V_{CL}$ of the capacitor line CL and a drain current $I_{ds\_2}$ flowing through the transistor Tr_2.

The floating gate FG can control voltage through the transistor Tr_1. For example, the voltage of the source line SL_1 is set to $V_{DD}$. In this case, when the voltage of the gate line GL_1 is set to be higher than or equal to the voltage obtained by adding $V_{DD}$ to the threshold voltage $V_{th}$ of the transistor Tr_1, the voltage of the floating gate FG can be HIGH. Further, when the voltage of the gate line GL_1 is set to be lower than or equal to the threshold voltage $V_{th}$ of the transistor Tr_1, the voltage of the floating gate FG can be LOW.

Thus, either a $V_{CL}$-$I_{ds\_2}$ curve (FG=LOW) or a $V_{CL}$-$I_{ds\_2}$ curve (FG=HIGH) can be obtained. That is, when FG=LOW, the $I_{ds\_2}$ is small at a $V_{CL}$ of 0V; accordingly, data 0 is stored. Further, when FG=HIGH, the $I_{ds\_2}$ is large at a $V_{CL}$ of 0V; accordingly, data 1 is stored. In this manner, data can be stored.

Since the off-state current of the transistor described in Embodiment 1 or 2 can be made to be extremely small, if the transistor described in Embodiment 1 or 2 is used as the transistor Tr_1 here, unintentional leak of electric charge accumulated in the floating gate FG through the transistor Tr_1 can be suppressed. Therefore, data can be held for a long period. By using an embodiment of the present invention, the threshold voltage of the transistor Tr_1 is controlled, which enables reduction in the voltage necessary for writing. Thus, power consumption can be made small as compared to a flash memory or the like.

Note that the transistor described in Embodiment 1 or 2 may also be applied to the transistor Tr_2.

Next, a structure of the nonvolatile memory shown in FIGS. 9A and 9B without the capacitor will be described with reference to FIG. 10.

Figure 10:
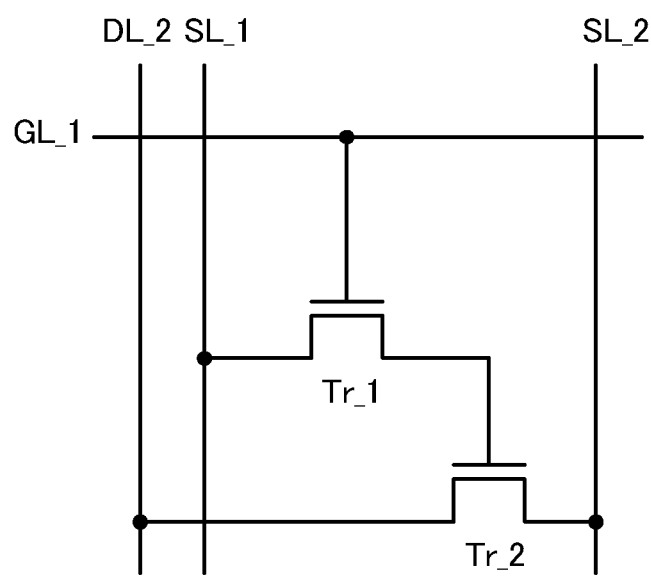
FIG. 10 is a circuit diagram illustrating an example of a semiconductor memory device including a transistor according to one embodiment of the present invention.

FIG. 10 is a circuit diagram of a NOR-type nonvolatile memory. The nonvolatile memory includes a transistor Tr_1, a gate line GL_1 connected to a gate of the transistor Tr_1, a source line SL_1 connected to a source of the transistor Tr_1, a transistor Tr_2, a source line SL_2 connected to a source of the transistor Tr_2, a drain line DL_2 connected to a drain of the transistor Tr_2, and a gate of the transistor Tr_2 connected to a drain of the transistor Tr_1

In the case where the transistor whose off-state current is small is used as the transistor Tr_1, electric charge can be held between the drain of the transistor Tr_1 and the gate of the transistor Tr_2 without the capacitor. The structure without the capacitor makes it possible to reduce an area of a memory, and the integration degree can be more increased than that of the structure with a capacitor.

Although the NOR-type nonvolatile memory including four or five wirings is described in this embodiment, a structure of the nonvolatile memory is not limited thereto. For example, a structure in which one wiring functions as the source line SL_1 and the drain line DL_2 may be employed. Further, one embodiment of the present invention may be applied to a NAND-type nonvolatile memory.

As described above, according to one embodiment of the present invention, a semiconductor memory device with high reliability for a long period and low power consumption can be obtained.

This embodiment can be implemented in appropriate combination with the other embodiments.

Embodiment 5

A central processing unit (CPU) can be formed using a transistor including an oxide semiconductor in an active layer for at least part of the CPU.

Figure 11A:
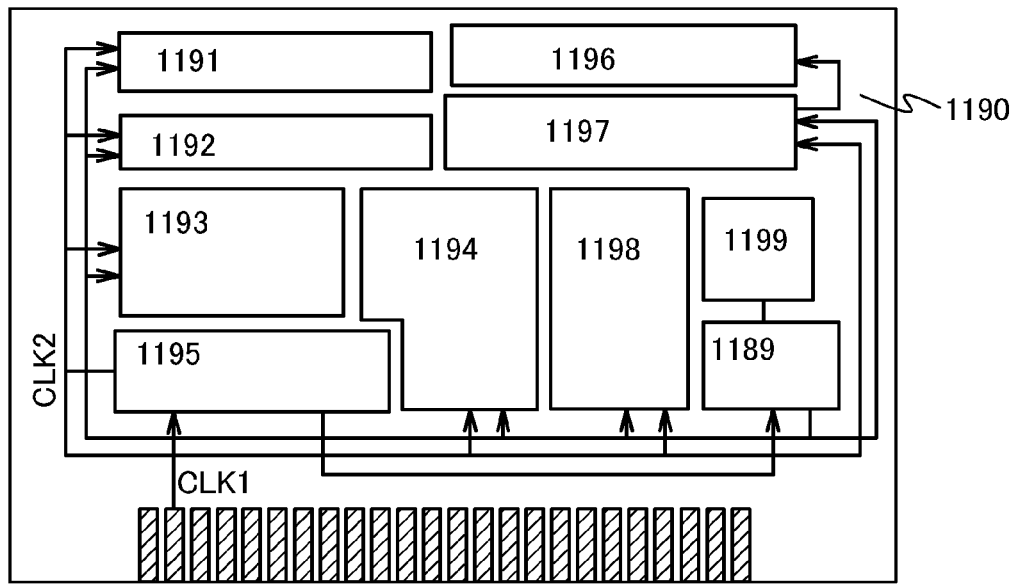
FIG. 11A is a block diagram illustrating a specific example of a CPU including a transistor according to one embodiment of the present invention and FIGS. 11B and 11C are circuit diagrams each illustrating part of the CPU.

FIG. 11A is a block diagram illustrating a specific structure of a CPU. The CPU shown in FIG. 11A includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and an ROM interface (ROM I/F) 1189 over a substrate 1190. A semiconductor substrate, an SOI substrate, a glass substrate, or the like is used as the substrate 1190. The ROM 1199 and the ROM interface 1189 may be provided over a separate chip. Obviously, the CPU illustrated in FIG. 11A is only an example in which the configuration is simplified, and an actual CPU may have various configurations depending on the application.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the clock signal CLK2 to the above circuits.

In the CPU illustrated in FIG. 11A, a memory element is provided in the register 1196. The memory element described in Embodiment 4 can be used as the memory element provided in the register 1196.

In the CPU illustrated in FIG. 11A, the register controller 1197 selects an operation of holding data in the register 1196 in accordance with an instruction from the ALU 1191. That is, the register controller 1197 selects whether data is held by a phase-inversion element or a capacitor in the memory element included in the register 1196. When data holding by the phase-inversion element is selected, a power supply voltage is supplied to the memory element in the register 1196. When data holding by the capacitor is selected, the data is rewritten in the capacitor, and supply of a power supply voltage to the memory element in the register 1196 can be stopped.

Figure 11B:
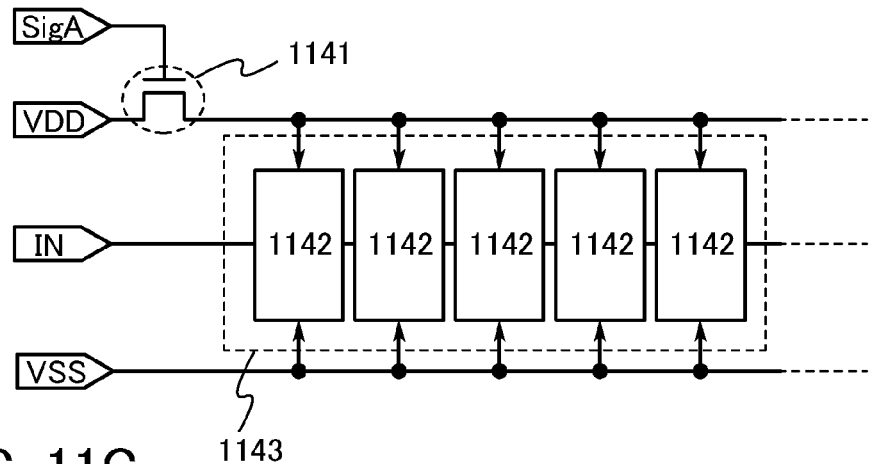
Figure 11C:
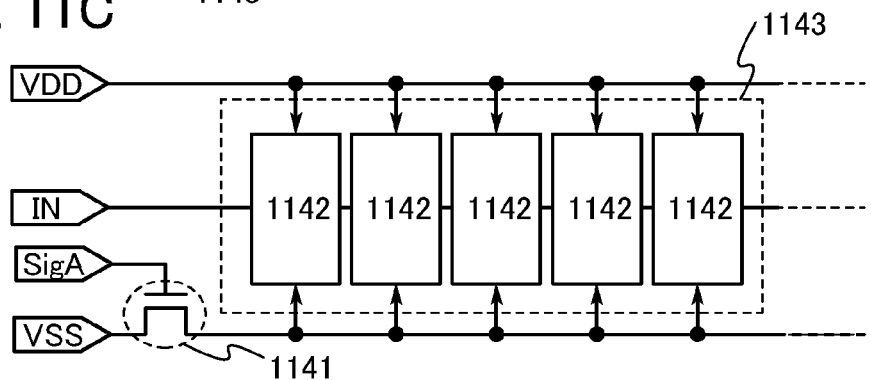

The power supply can be stopped by providing a switching element between a memory element group and a node to which a power supply potential $V_{DD}$ or a power supply potential $V_{SS}$ is supplied, as illustrated in FIG. 11B or FIG. 11C. Circuits illustrated in FIGS. 11B and 11C are described below.

FIGS. 11B and 11C each illustrate an example of a structure of a memory circuit including a transistor including an oxide semiconductor in an active layer as a switching element for controlling supply of a power supply potential to a memory element.

The memory device illustrated in FIG. 11B includes a switching element 1141 and a memory element group 1143 including a plurality of memory elements 1142. Specifically, as each of the memory elements 1142, the memory element described in Embodiment 4 can be used. Each of the memory elements 1142 included in the memory element group 1143 is supplied with the high-level power supply potential $V_{DD}$ via the switching element 1141. Further, each of the memory elements 1142 included in the memory element group 1143 is supplied with a potential of a signal IN and the low-level power supply potential $V_{SS}$.

In FIG. 11B, a transistor including a semiconductor with a large band gap such as an oxide semiconductor in an active layer is used as the switching element 1141, and the switching of the transistor is controlled by a signal Sig A supplied to a gate thereof.

Note that FIG. 11B illustrates the structure in which the switching element 1141 includes only one transistor; however, without limitation thereto, the switching element 1141 may include a plurality of transistors. In the case where the switching element 1141 includes a plurality of transistors which serve as switching elements, the plurality of transistors may be connected to each other in parallel, in series, or in combination of parallel connection and series connection.

Although the switching element 1141 controls the supply of the high-level power supply potential $V_{DD}$ to each of the memory elements 1142 included in the memory element group 1143 in FIG. 11B, the switching element 1141 may control the supply of the low-level power supply potential $V_{SS}$.

In FIG. 11C, an example of a memory device in which each of the memory elements 1142 included in the memory element group 1143 is supplied with the low-level power supply potential $V_{SS}$ via the switching element 1141 is illustrated. The supply of the low-level power supply potential $V_{SS}$ to each of the memory elements 1142 included in the memory element group 1143 can be controlled by the switching element 1141.

When a switching element is provided between a memory element group and a node to which the power supply potential $V_{DD}$ or the power supply potential $V_{SS}$ is supplied, data can be held even in the case where operation of a CPU is temporarily stopped and the supply of the power supply voltage is stopped; accordingly, power consumption can be reduced. Specifically, for example, while a user of a personal computer does not input data to an input device such as a keyboard, the operation of the CPU can be stopped, so that the power consumption can be reduced.

Although the CPU is given as an example, the transistor can also be applied to an LSI such as a digital signal processor (DSP), a custom LSI, or a field programmable gate array (FPGA).

This embodiment can be implemented in appropriate combination with the other embodiments.

Embodiment 6

In this embodiment, examples of electronic devices to which any of Embodiments 1 to 3 is applied will be described.

Figure 12A:
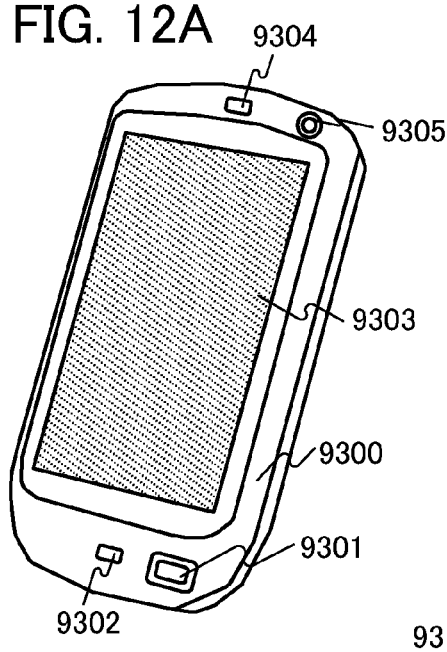
FIGS. 12A to 12C are perspective views each illustrating an example of an electronic device according to one embodiment of the present invention.

FIG. 12A illustrates a portable information terminal, which includes a housing 9300, a button 9301, a microphone 9302, a display portion 9303, a speaker 9304, and a camera 9305, and has a function as a mobile phone. One embodiment of the present invention can be applied to the display portion 9303 and the camera 9305. Although not illustrated, one embodiment of the present invention can also be applied to an arithmetic unit, a wireless circuit, or a memory circuit inside the main body.

Figure 12B:
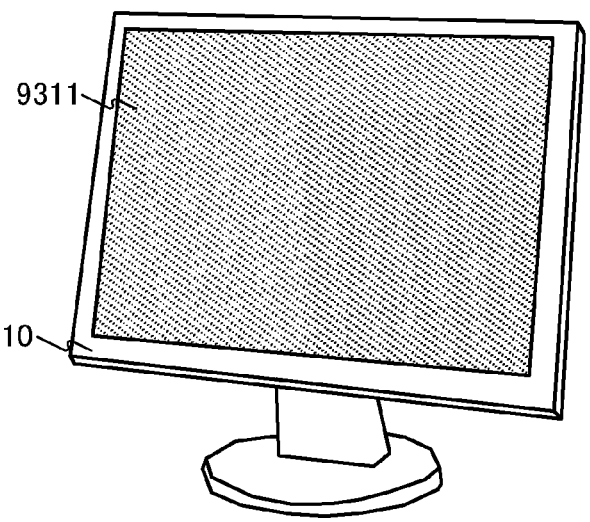

FIG. 12B illustrates a display, which includes a housing 9310 and a display portion 9311. One embodiment of the present invention can be applied to the display portion 9311. When one embodiment of the present invention is employed, a display having high display quality can be provided even in the case where the size of the display portion 9311 is increased.

Figure 12C:
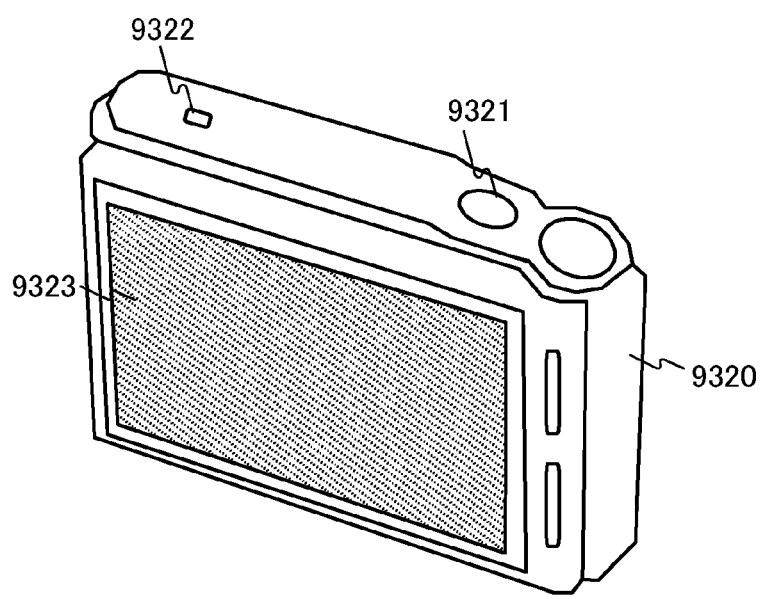

FIG. 12C illustrates a digital still camera, which includes a housing 9320, a button 9321, a microphone 9322, and a display portion 9323. One embodiment of the present invention can be applied to the display portion 9323. Although not illustrated, one embodiment of the present invention can also be applied to a memory circuit or an image sensor.

When one embodiment of the present invention is employed, cost of an electronic device can be reduced. Further, a display device having high display quality can be obtained.

This embodiment can be implemented in appropriate combination with the other embodiments.

Example 1

In this example, a property of a silicon oxide film having a negative fixed charge that is one embodiment of the present invention is described.

Figure 13A:
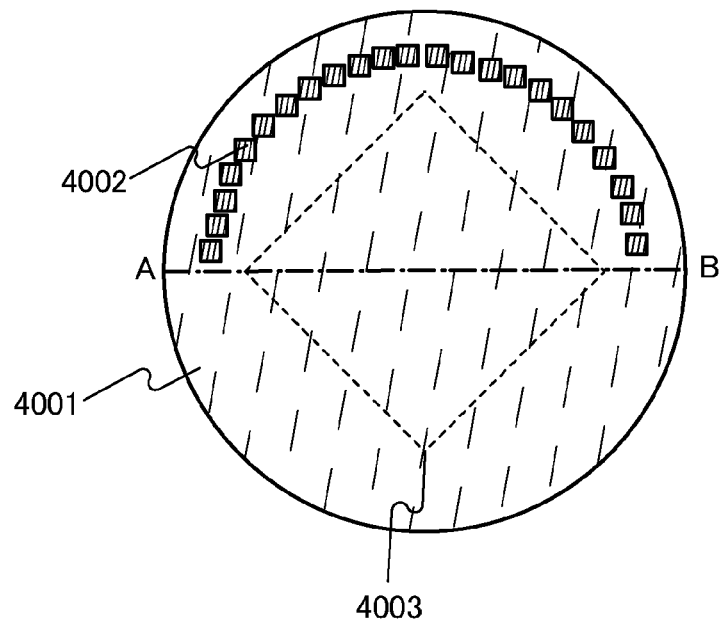
FIGS. 13A to 13C are diagrams illustrating an example of a film formation method of a silicon oxide film having a negative fixed charge according to one embodiment of the present invention.

The silicon oxide film having a negative fixed charge was manufactured using a silicon oxide target over which an aluminum oxide sintered body was set. Specifically, 24 aluminum oxide sintered bodies 4002 each having a size of 10 mm×10 mm were set over a circular silicon oxide target 4001 with the diameter of 300 mm with the arrangement shown in FIG. 13A. Note that the setting position of the aluminum oxide sintered bodies 4002 overlapped with erosion regions formed in the silicon oxide target 4001.

Figure 13B:
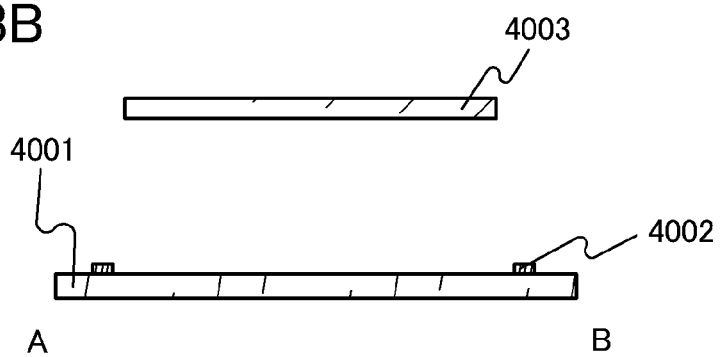

Here, positional relation of the silicon oxide target 4001, the aluminum oxide sintered bodies 4002, and the substrate 4003 is described. FIG. 13B is a cross section A-B along alternate long and short dash line A-B in FIG. 13A. By setting the substrate 4003 in the position of FIGS. 13A and 13B, aluminum was intentionally added to the silicon oxide film, and a silicon oxide film having an aluminum concentration gradient was formed in the plane of the substrate 4003. Further, as a comparative example, a substrate provided with a silicon oxide film formed by using the silicon oxide target 4001 as above without setting aluminum oxide thereover was prepared.

The silicon oxide film was formed to a thickness of 100 nm over the substrate 4003 by a sputtering method. Film formation was performed under conditions where the distance between the substrate 4003 and the target was 60 mm, a DC power source was used, the power was 2 kw, and the pressure was 0.4 Pa. Further, the substrate temperature during the film formation was 100° C., and a sputtering gas including argon at a flow rate of 25 sccm and oxygen at a flow rate of 25 sccm was used. A silicon wafer was used as the substrate 4003.

Figure 13C:
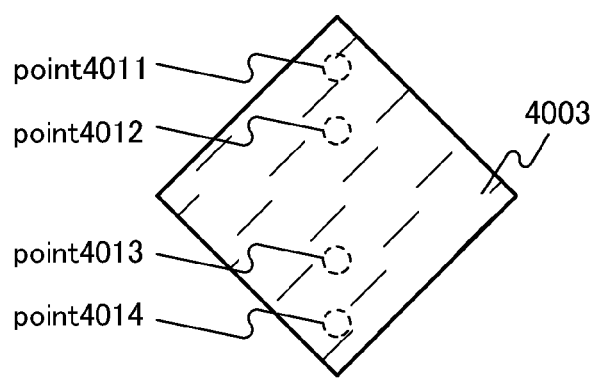

In the substrate 4003, the aluminum concentrations at a point 4011, a point 4012, a point 4013, and a point 4014 in the silicon oxide film are expressed by Condition 1, Condition 2, Condition 3, and Condition 4, respectively (FIG. 13(C)). Further, a point of the silicon oxide film to which aluminum was not added is expressed by Condition 5.

The Aluminum concentration in the silicon oxide film in Conditions 1 to 5 was quantified by Inductively Coupled Plasma Mass Spectrometry (ICP-MS), and Table 1 shows the result. Note that as the film density of the silicon oxide film, $6.4 \times 10^{22}$ cm$^{-3}$, which was derived from RBS performed separately was used when the unit of cm$^{-3}$ was converted into at. %. A sample for the ICP-MS was formed so that an average thickness in the substrate plane was about 100 nm.

plane of about 100 nm, and by forming aluminum titanium (titanium: 1 weight %) processed into a circle with the diameter of 1 mm over the silicon oxide film. Further, as a comparative example, a MOS capacitor was fabricated using the silicon oxide film formed under Condition 5 to which aluminum was not added, and C-V measurement was performed.

Two kinds of the MOS capacitors using an n-type silicon wafer and p-type silicon wafer as the substrate were fabricated under each condition. Note that hydrogenation treatment was performed on the MOS capacitors at 350° C. for 1 hour under a 100% nitrogen atmosphere before the C-V measurement.

Figure 14A:
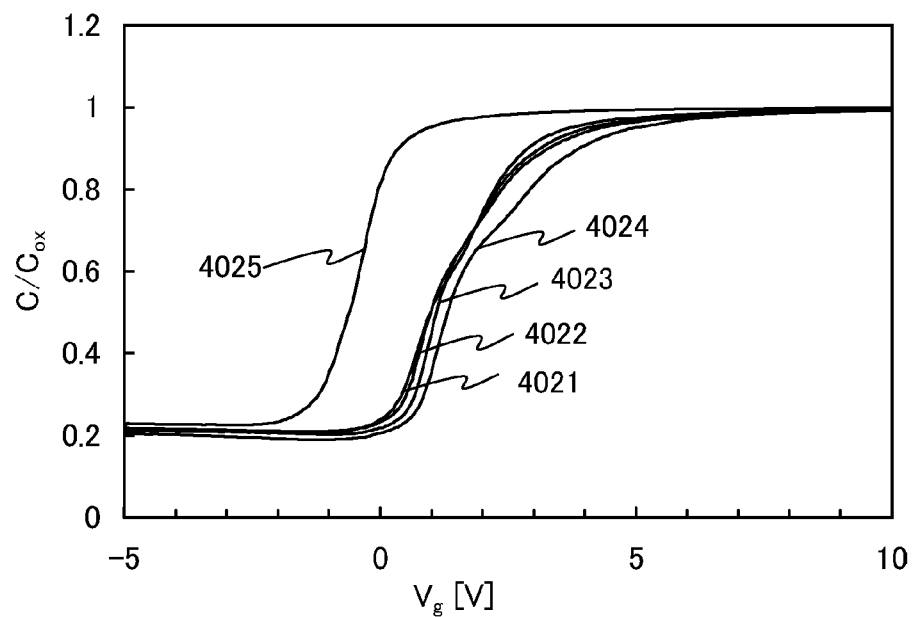
FIGS. 14A and 14B are graphs each illustrating C-V characteristics according to one embodiment of the present invention.
Figure 14B:
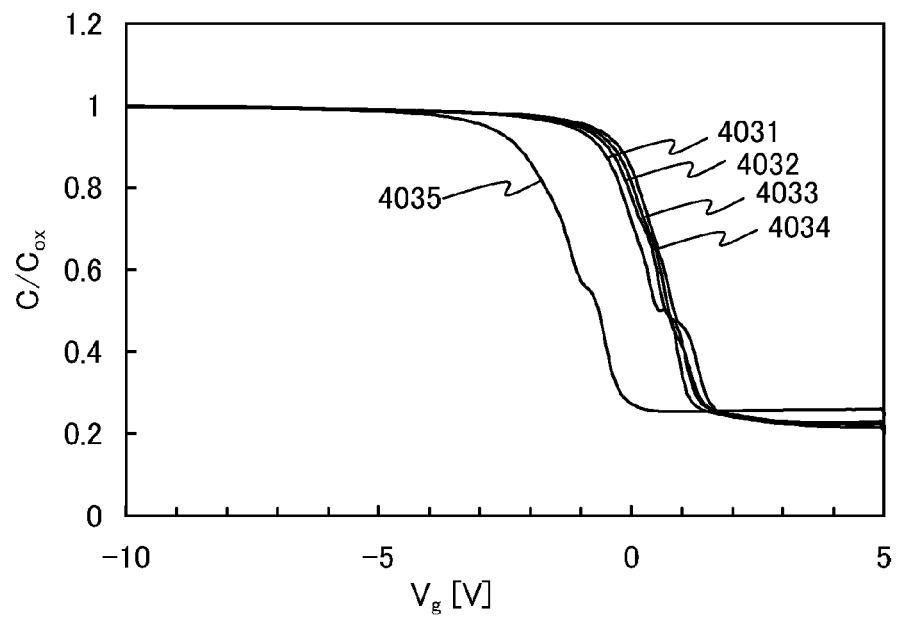

FIG. 14A is a C-V curve when the n-type silicon wafer was used, and FIG. 14B is a C-V curve when the p-type silicon wafer was used. The vertical axis represents a capacitance value ($C/C_{ox}$) normalized by the capacitance value of the oxide film, and the horizontal axis represents a voltage ($V_g$) applied to aluminum titanium that is a gate electrode.

In FIG. 14A, 4021 is a C-V curve under Condition 1; 4022 is a C-V curve under Condition 2; 4023 is a C-V curve under Condition 3; 4024 is a C-V curve under Condition 4; and 4025

TABLE 1

|  | Condition 1 | Condition 2 | Condition 3 | Condition 4 | Condition 5 |
|---|---|---|---|---|---|
| Aluminum Concentration [cm$^{-3}$] | $6.5 \times 10^{19}$ | $1.2 \times 10^{20}$ | $2.0 \times 10^{20}$ | $5.6 \times 10^{20}$ | $7.4 \times 10^{17}$ |
| Aluminum Concentration [at. %] | 0.10 | 0.19 | 0.32 | 0.88 | 0 |

As shown in Table 1, the aluminum concentration can be controlled by the positions or the amount of the aluminum oxide sintered bodies which are set over the silicon oxide target. Further, the aluminum concentration included in the silicon oxide film can be varied in the substrate plane.

Using silicon oxide films formed under Conditions 1 to 4, Metal-Oxide-Semiconductor (MOS) capacitors were fabricated, and capacitance-voltage (C-V) measurement was performed. A MOS capacitor was fabricated by forming a silicon oxide film which has an average thickness in the substrate is a C-V curve under Condition 5. In FIG. 14B, 4031 is a C-V curve under Condition 1; 4032 is a C-V curve under Condition 2; 4033 is a C-V curve under Condition 3; 4034 is a C-V curve under Condition 4; and 4035 is a C-V curve under Condition 5.

Table 2 represents a flat-band voltage ($V_{fb}$), a capacitance value of an oxide film ($C_{ox}$), a film thickness of an oxide film ($t_{ox}$), a relative permittivity ($\epsilon_{ox}$), and an interface state charge density ($Q_{SS}/q$), which were derived from the C-V curve when the n-type silicon wafer was used. Table 3 represents a $V_{fb}$, a $C_{ox}$, a $t_{ox}$, a $\epsilon_{ox}$, and a $Q_{SS}/q$, which were derived from the C-V curve when the p-type silicon wafer was used.

TABLE 2

|  | Condition 1 | Condition 2 | Condition 3 | Condition 4 | Condition 5 |
|---|---|---|---|---|---|
| $V_{fb}$ [V] | 0.84 | 0.91 | 1.11 | 1.22 | −0.64 |
| $C_{ox}$ [F] | $2.6 \times 10^{-10}$ | $2.6 \times 10^{-10}$ | $2.7 \times 10^{-10}$ | $2.8 \times 10^{-10}$ | $2.6 \times 10^{-10}$ |
| $t_{ox}$ [nm] | 101 | 101 | 97 | 94 | 102 |
| $\epsilon_{ox}$ | 3.81 | 3.82 | 3.80 | 3.81 | 3.82 |
| $Q_{SS}/q$ [cm$^{-2}$] | $1.9 \times 10^{11}$ | $2.1 \times 10^{11}$ | $2.6 \times 10^{11}$ | $2.9 \times 10^{11}$ | $1.1 \times 10^{11}$ |

TABLE 3

|  | Condition 1 | Condition 2 | Condition 3 | Condition 4 | Condition 5 |
|---|---|---|---|---|---|
| $V_{fb}$ [V] | 0.39 | 0.56 | 0.65 | 0.68 | −1.38 |
| $C_{ox}$ [F] | $2.6 \times 10^{-10}$ | $2.6 \times 10^{-10}$ | $2.7 \times 10^{-10}$ | $2.8 \times 10^{-10}$ | $2.6 \times 10^{-10}$ |
| $t_{ox}$ [nm] | 101 | 101 | 97 | 94 | 101 |
| $\epsilon_{ox}$ | 3.80 | 3.82 | 3.80 | 3.81 | 3.74 |
| $Q_{SS}/q$ [cm$^{-2}$] | $2.1 \times 10^{11}$ | $2.5 \times 10^{11}$ | $2.8 \times 10^{11}$ | $3.0 \times 10^{11}$ | $1.5 \times 10^{11}$ |

The relation among the $C_{ox}$, $t_{ox}$, and $\epsilon_{ox}$ is as expressed by Formula 2. Here, the $t_{ox}$ was derived from film thickness measurement with a light interferometer thickness measuring device (NanoSpec 6100 produced by Nanometrics, Inc.) and applied to the Formula 2, whereby $\epsilon_{ox}$ was determined.

$$C_{OX} = \frac{S}{t_{OX}} \cdot \varepsilon_0 \cdot \varepsilon_{OX} \qquad \text{[Formula 2]}$$

Here, S and $\epsilon_{ox}$ represent a gate electrode area and a vacuum permittivity, respectively.

Further, the relation among $Q_{SS}/q$, $C_{ox}$, $t_{ox}$, and $V_{fb}$ is expressed by Formula 3.

$$\frac{Q_{SS}}{q} = \frac{C_{OX}}{S \times q} |\phi_{MS} - V_{fb}| \qquad \text{[Formula 3]}$$

Here, q and $\phi_{MS}$ represent elementary charge and a value obtained by subtracting the work function of the silicon wafer from the work function of the gate electrode, respectively. The work function of aluminum titanium that is the gate electrode, measured using a photoelectron spectrometer for use in air (AC-2, produced by Riken Keiki Co., Ltd.) was 4.26 eV. Further, the work functions of the n-type silicon wafer and the p-type silicon wafer which were derived from resistivity was 4.34 eV and 4.90 eV, respectively. That is, $\phi_{MS}$ is estimated to be −0.084 eV in the n-type silicon wafer and −0.641 eV in the p-type silicon wafer.

Here, if $V_{fb}$ agrees with $\phi_{MS}$, no fixed charge exists in the silicon oxide film. In each of Conditions 1 to 4, $V_{fb}$ is smaller than $\phi_{MS}$; thus, it turns out that a negative fixed charge exists in the silicon oxide film. On the other hand, in Condition 5, $V_{fb}$ is larger than $\phi_{MS}$; thus, it turns out that a positive fixed charge exists in the silicon oxide film.

Figure 15A:
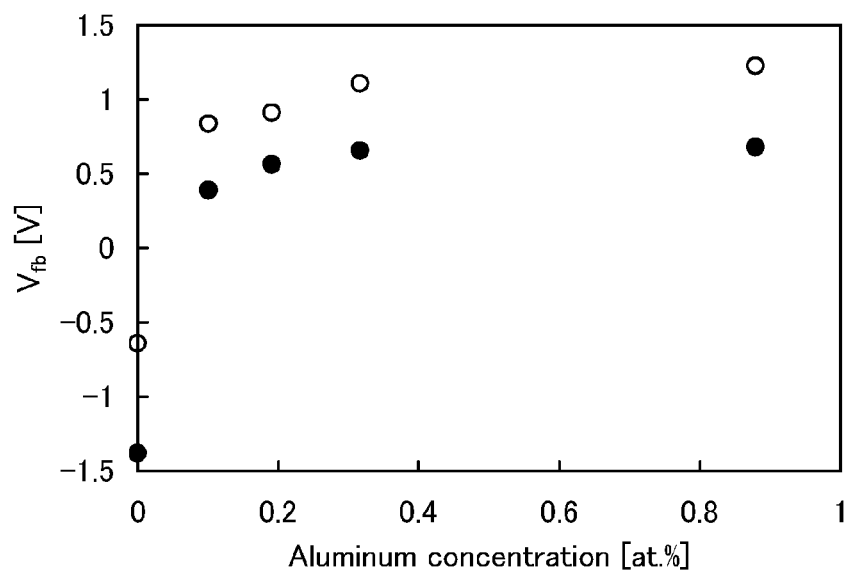
FIGS. 15A and 15B are graphs illustrating the relation between an aluminum concentration in a silicon oxide film and $V_{fb}$, and relation between an aluminum concentration in a silicon oxide film and $Q_{SS}/q$.
Figure 15B:
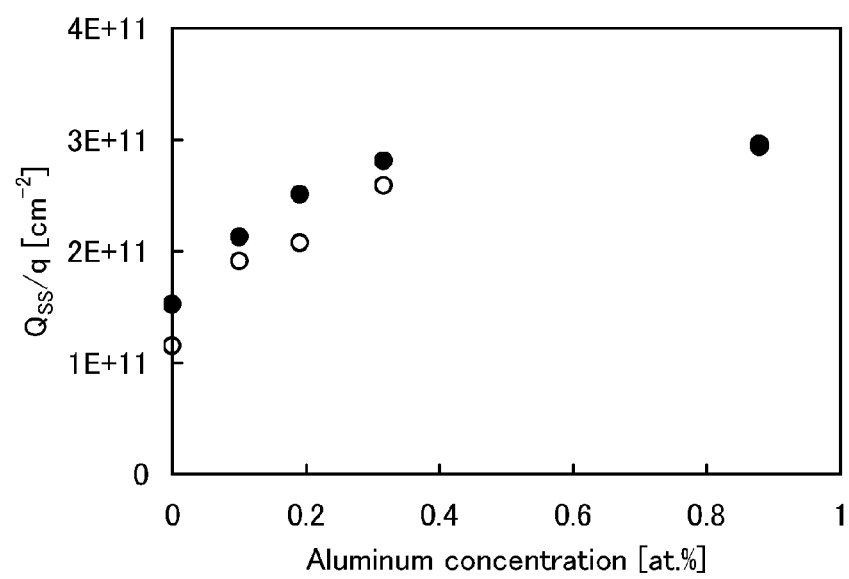

FIGS. 15A and 15B show the relation between aluminum concentration and $V_{fb}$ in the silicon oxide film and the relation between aluminum concentration and $Q_{SS}/q$ in the silicon oxide film, respectively. Here, $V_{fb}$ of the n-type silicon wafer is represented by white circle, and $V_{fb}$ of the p-type silicon wafer is represented by black circle.

From FIG. 15A, it is found that $V_{fb}$ increases regardless of the n-type silicon wafer and p-type silicon wafer as the aluminum concentration in the silicon oxide film increases. From FIG. 15B, it is found that the negative fixed charge in the silicon oxide film increases regardless of the n-type silicon wafer and p-type silicon wafer as the aluminum concentration in the silicon oxide film increases.

Next, J-E (current density-electric field strength) measurement was performed using the MOS capacitors that had used for the C-V measurement.

Figure 16A:
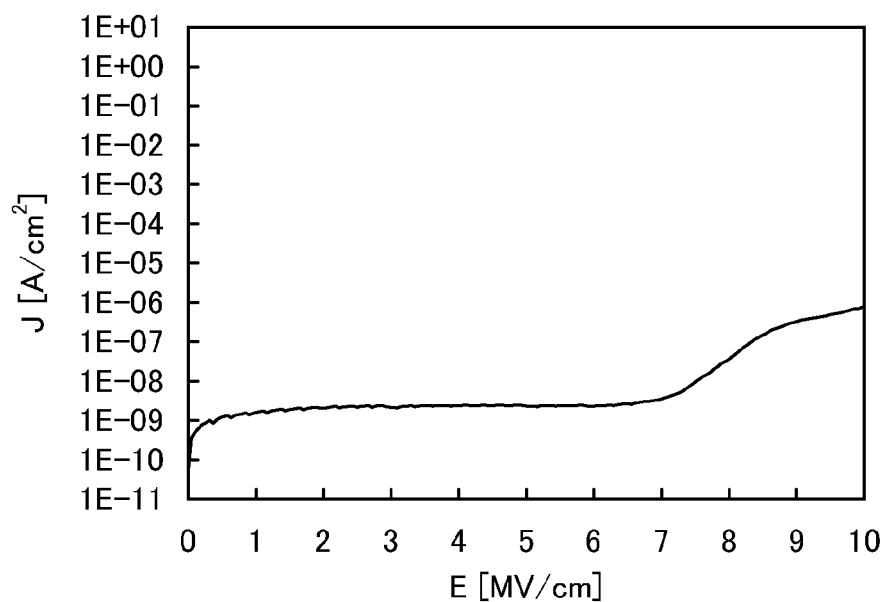
FIGS. 16A and 16B are graphs each illustrating J-E characteristics according to one embodiment of the present invention.
Figure 16B:
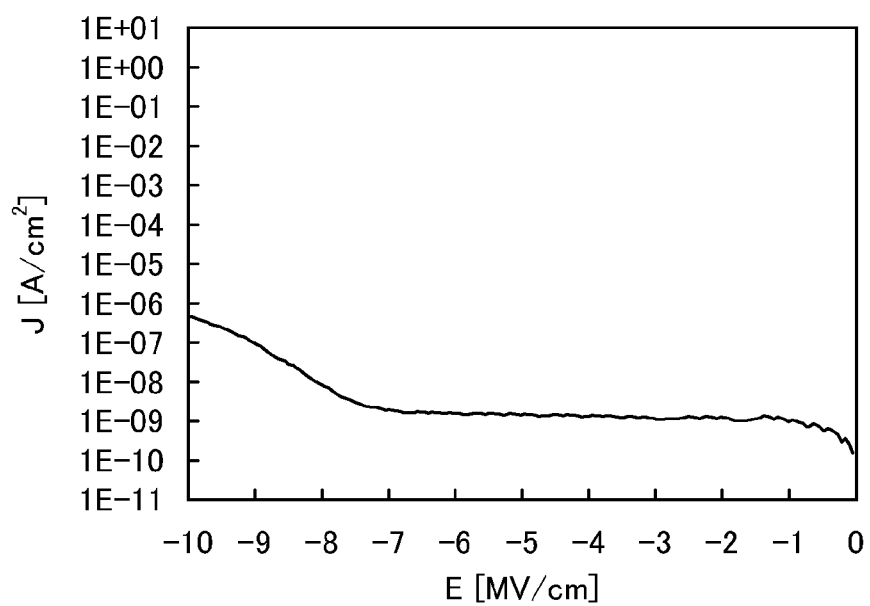

FIGS. 16A and 16B show J-E curves in the silicon oxide films formed under Condition 4 where aluminum concentration was the highest. FIG. 16A is the J-E curve when the n-type silicon wafer was used. FIG. 16B is the J-E curve when the p-type silicon wafer was used. From FIGS. 16A and 16B, it is found that the silicon oxide films formed under Condition 4 have a sufficient withstand voltage to the operation of the transistor.

Figure 17A:
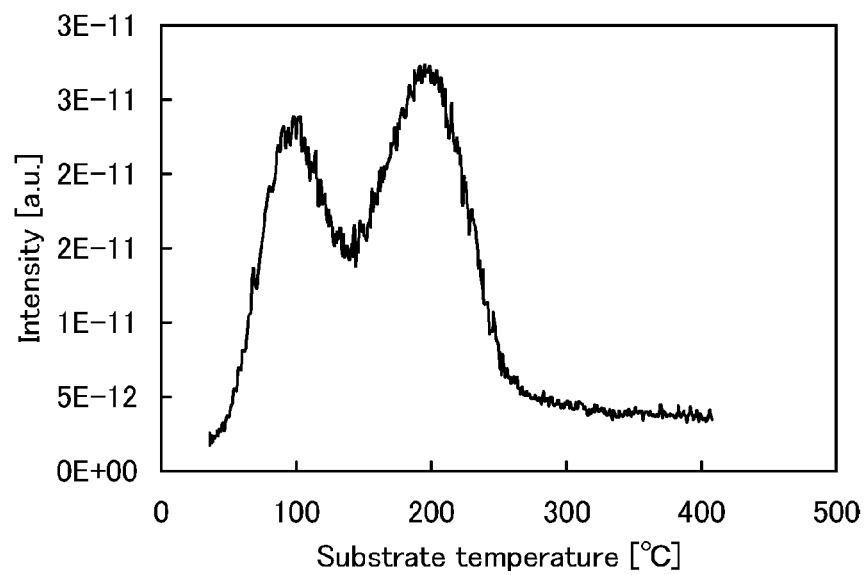
FIGS. 17A and 17B are graphs each illustrating a TDS spectrum of a silicon oxide film according to one embodiment of the present invention.
Figure 17B:
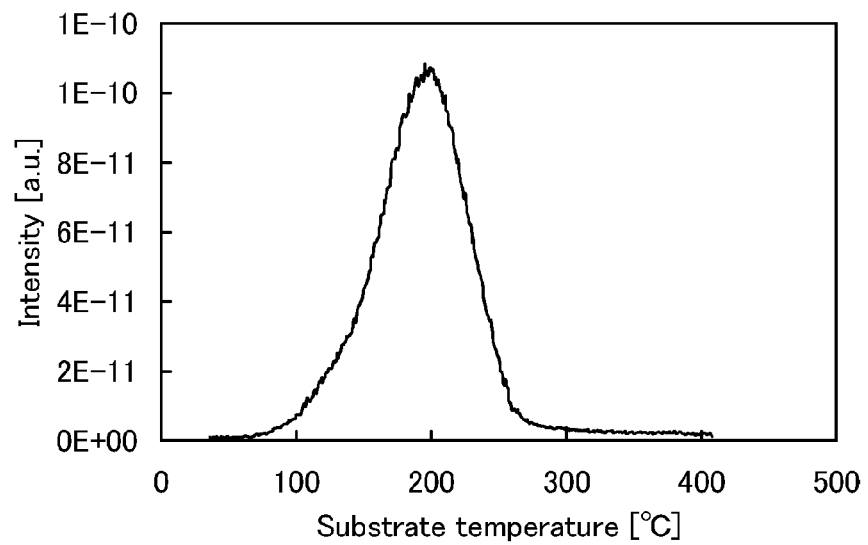

Next, TDS was performed on the silicon oxide film having aluminum concentration gradient formed over a glass substrate (including the film formed under Conditions 1 to 4), and the amount of released oxygen was examined. FIGS. 17A and 17B show TDS spectra under Condition 1 as a typical example. Here, FIG. 17A is a TDS spectrum when m/z=16, and FIG. 17B is a TDS spectrum when m/z=32.

The amount of released oxygen per unit volume in the silicon oxide film, obtained from the TDS spectra under Condition 1, Condition 2, Condition 3, and Condition 4, was $1.7 \times 10^{20}$ cm$^{-3}$, $1.5 \times 10^{20}$ cm$^{-3}$, $1.6 \times 10^{20}$ cm$^{-3}$, and $1.7 \times 10^{20}$ cm$^{-3}$, respectively. The results show that the silicon oxide film obtained under Conditions 1 to 4 is a film from which oxygen is released by heat treatment.

According to this example, it is found that a negative fixed charge is increased by increasing the amount of aluminum added to the silicon oxide film. Further, it is found that the characteristics of the silicon oxide film are not degraded by adding aluminum during the film formation of the silicon oxide film.

This application is based on Japanese Patent Application serial no. 2011-047098 filed with Japan Patent Office on Mar. 4, 2011, the entire contents of which are hereby incorporated by reference.

What is claimed is:

1. A semiconductor device comprising:
    a gate electrode;
    a gate insulating film over the gate electrode;
    a pair of electrodes over the gate insulating film;
    an oxide semiconductor film which at least partially overlaps with the gate electrode and is at least partially in contact with the pair of electrodes; and
    an insulating film over the oxide semiconductor film,
    wherein at least one of the gate insulating film and the insulating film includes a silicon oxide film having a negative fixed charge and an oxygen-excess silicon oxide film,
    wherein a first edge of the gate electrode, a second edge of the pair of electrodes, and a third edge of the oxide semiconductor film are parallel to a channel length direction when seen from above, and
    wherein the first edge is between the second edge and the third edge in a channel width direction when seen from above.

2. The semiconductor device according to claim 1, wherein the oxide semiconductor film includes two or more elements selected from In, Ga, Zn, and Sn.

3. The semiconductor device according to claim 1, wherein the silicon oxide film having the negative fixed charge includes an impurity, the impurity being selected from the group consisting of B, Ga, In, and a combination thereof.

4. The semiconductor device according to claim 3, wherein a concentration of the impurity is greater than or equal to 0.01 at. % and less than or equal to 10 at. %.

5. The semiconductor device according to claim 1, wherein the silicon oxide film having the negative fixed charge has a surface charge density on the oxide semiconductor film side of greater than or equal to $1 \times 10^{10}$ cm$^{-2}$ and less than or equal to $5 \times 10^{11}$ cm$^{-2}$.

6. The semiconductor device according to claim 1,
    wherein the oxide semiconductor film includes a channel region, a source region, and a drain region, and
    wherein the pair of electrodes is in contact with the source region and the drain region of the oxide semiconductor film through openings provided in the insulating film.

7. A semiconductor device comprising:
    a base insulating film;
    an oxide semiconductor film over the base insulating film;
    a pair of electrodes at least partially in contact with the oxide semiconductor film;
    a gate insulating film over the oxide semiconductor film; and a gate electrode which at least partially overlaps with the oxide semiconductor film with the gate insulating film interposed therebetween, wherein at least one of the base insulating film and the gate insulating film includes a silicon oxide film having a negative fixed charge and an oxygen-excess silicon oxide film, wherein a first edge of the gate electrode, a second edge of the pair of electrodes, and a third edge of the oxide semiconductor film are parallel to a channel length direction when seen from above, and wherein the first edge is between the second edge and the third edge in a channel width direction when seen from above.

8. The semiconductor device according to claim 7, wherein the oxide semiconductor film includes two or more elements selected from In, Ga, Zn, and Sn.

9. The semiconductor device according to claim 7, wherein the silicon oxide film having the negative fixed charge includes an impurity, the impurity being selected from the group consisting of B, Ga, In, and a combination thereof.

10. The semiconductor device according to claim 9, wherein a concentration of the impurity is greater than or equal to 0.01 at. % and less than or equal to 10 at. %.

11. The semiconductor device according to claim 7,
wherein the silicon oxide film having the negative fixed charge has a surface charge density on the oxide semiconductor film side of greater than or equal to $1\times10^{10}$ cm$^{-2}$ and less than or equal to $5\times10^{11}$ cm$^{-2}$.

12. The semiconductor device according to claim 7,
wherein the oxide semiconductor film includes a channel region, a source region, and a drain region,
wherein an insulating film is provided between the pair of electrodes and the oxide semiconductor film; and
wherein the pair of electrodes is in contact with the source region and the drain region of the oxide semiconductor film through openings provided in the insulating film.

13. A semiconductor device comprising:
a gate electrode;
a gate insulating film over the gate electrode;
a pair of electrodes over the gate insulating film;
an oxide semiconductor film which at least partially overlaps with the gate electrode and is at least partially in contact with the pair of electrodes; and
an insulating film over the oxide semiconductor film,
wherein at least one of the gate insulating film and the insulating film comprises a silicon oxide film including an impurity selected from the group consisting of B, Ga, In, and a combination thereof and an oxygen-excess silicon oxide film,
wherein a first edge of the gate electrode, a second edge of the pair of electrodes, and a third edge of the oxide semiconductor film are parallel to a channel length direction when seen from above, and
wherein the first edge is between the second edge and the third edge in a channel width direction when seen from above.

14. The semiconductor device according to claim 13, wherein the oxide semiconductor film includes two or more elements selected from In, Ga, Zn, and Sn.

15. The semiconductor device according to claim 13, wherein a concentration of the impurity is greater than or equal to 0.01 at. % and less than or equal to 10 at. %.

16. A semiconductor device comprising:
a base insulating film;
an oxide semiconductor film over the base insulating film;
a pair of electrodes at least partially in contact with the oxide semiconductor film;
a gate insulating film over the oxide semiconductor film; and
a gate electrode which at least partially overlaps with the oxide semiconductor film with the gate insulating film interposed therebetween, wherein at least one of the base insulating film and the gate insulating film comprises a silicon oxide film including an impurity selected from the group consisting of B, Ga, In, and a combination thereof and an oxygen-excess silicon oxide film, wherein a first edge of the gate electrode, a second edge of the pair of electrodes, and a third edge of the oxide semiconductor film are parallel to a channel length direction when seen from above, and wherein the first edge is between the second edge and the third edge in a channel width direction when seen from above.

17. The semiconductor device according to claim 16, wherein the oxide semiconductor film includes two or more elements selected from In, Ga, Zn, and Sn.

18. The semiconductor device according to claim 16, wherein a concentration of the impurity is greater than or equal to 0.01 at. % and less than or equal to 10 at. %.

19. A semiconductor device comprising:
a gate electrode;
a gate insulating film over the gate electrode;
a pair of electrodes over the gate insulating film;
an oxide semiconductor film which at least partially overlaps with the gate electrode and is at least partially in contact with the pair of electrodes; and
an insulating film over the oxide semiconductor film,
wherein at least one of the gate insulating film and the insulating film comprises an oxygen-excess silicon oxide film having a negative fixed charge,
wherein a first edge of the gate electrode, a second edge of the pair of electrodes, and a third edge of the oxide semiconductor film are parallel to a channel length direction when seen from above, and
wherein the first edge is between the second edge and the third edge in a channel width direction when seen from above.

20. The semiconductor device according to claim 19, wherein the oxide semiconductor film includes two or more elements selected from In, Ga, Zn, and Sn.

21. The semiconductor device according to claim 19, wherein the oxygen-excess silicon oxide film having the negative fixed charge includes an impurity, the impurity being selected from the group consisting of B, Ga, In, and a combination thereof.

22. The semiconductor device according to claim 21, wherein a concentration of the impurity is greater than or equal to 0.01 at. % and less than or equal to 10 at. %.

23. A semiconductor device comprising:
a gate electrode;
a gate insulating film over the gate electrode;
a pair of electrodes over the gate insulating film;
a semiconductor film which at least partially overlaps with the gate electrode and is at least partially in contact with the pair of electrodes; and
an insulating film over the semiconductor film,
wherein at least one of the gate insulating film and the insulating film comprises a silicon oxide film including an impurity selected from the group consisting of B, Ga, In, and a combination thereof, wherein a first edge of the gate electrode, a second edge of the pair of electrodes, and a third edge of the semiconductor film are parallel to a channel length direction when seen from above, and wherein the first edge is between the second edge and the third edge in a channel width direction when seen from above.

24. The semiconductor device according to claim 23, wherein a concentration of the impurity is greater than or equal to 0.01 at. % and less than or equal to 10 at. %.

* * * * *